United States Patent
Kubota et al.

(10) Patent No.: US 8,492,069 B2
(45) Date of Patent: Jul. 23, 2013

(54) LITHOGRAPHIC PRINTING PLATE PRECURSOR AND PLATE MAKING METHOD OF LITHOGRAPHIC PRINTING PLATE

(75) Inventors: Yasuhiro Kubota, Shizuoka (JP); Toyohisa Oya, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 291 days.

(21) Appl. No.: 12/892,262

(22) Filed: Sep. 28, 2010

(65) Prior Publication Data
US 2011/0076616 A1    Mar. 31, 2011

(30) Foreign Application Priority Data

Sep. 29, 2009   (JP) ................................ 2009-225554

(51) Int. Cl.
*G03F 7/00*    (2006.01)
*G03F 7/26*    (2006.01)
*B41M 5/00*    (2006.01)
*B41N 1/00*    (2006.01)

(52) U.S. Cl.
USPC ...... 430/270.1; 430/302; 101/453; 101/463.1

(58) Field of Classification Search
USPC ................. 430/270.1, 302; 101/450.1, 453, 101/463.1
See application file for complete search history.

(56) References Cited

U.S. PATENT DOCUMENTS

| 2004/0234883 A1* | 11/2004 | Maemoto ...................... 430/138 |
| 2006/0269873 A1* | 11/2006 | Knight et al. ................. 430/302 |
| 2007/0072113 A1* | 3/2007 | Taguchi ..................... 430/270.1 |
| 2008/0311509 A1* | 12/2008 | Williamson et al. ....... 430/273.1 |
| 2009/0087779 A1* | 4/2009 | Mori ......................... 430/273.1 |
| 2009/0246693 A1* | 10/2009 | Nakamura et al. ......... 430/283.1 |

FOREIGN PATENT DOCUMENTS

| JP | 2004-209704 A | 7/2004 |
| JP | 2005-165012 A | 6/2005 |
| JP | 4222026 B2 | 2/2009 |
| JP | 4279656 B2 | 6/2009 |

* cited by examiner

*Primary Examiner* — Cynthia H Kelly
*Assistant Examiner* — Chanceity Robinson
(74) *Attorney, Agent, or Firm* — Birch, Stewart, Kolasch & Birch, LLP

(57) ABSTRACT

A lithographic printing plate precursor, comprising a support having thereon an image-recording layer containing (A) an infrared absorbing agent, (B) a radical polymerization initiator, (C) a radical polymerizable compound, (D) a polymer compound containing a polyoxyalkylene structure and (E) an ultraviolet absorbing agent and being capable of forming an image by supplying at least one of printing ink and dampening water on a printing machine after imagewise exposure to remove an unexposed area of the image-recording layer.

6 Claims, No Drawings

LITHOGRAPHIC PRINTING PLATE PRECURSOR AND PLATE MAKING METHOD OF LITHOGRAPHIC PRINTING PLATE

BACKGROUND OF THE INVENTION

1. Field of the Invention

The present invention relates to a lithographic printing plate precursor, particularly, to a lithographic printing plate precursor containing an ultraviolet absorbing agent in its image-recording layer. More specifically, it relates to a lithographic printing plate precursor which is excellent in handling property under a mercury lamp and which is capable of forming an image by supplying printing ink and dampening water on a printing machine after imagewise exposure to remove the unexposed area.

2. Description of the Related Art

In general, a lithographic printing plate is composed of an oleophilic image area accepting ink and a hydrophilic non-image area accepting dampening water in the process of printing. Lithographic printing is a printing method utilizing the nature of water and oily ink to repel with each other and comprising rendering the oleophilic image area of the lithographic printing plate to an ink-receptive area and the hydrophilic non-image area thereof to a dampening water-receptive area (ink-unreceptive area), thereby making a difference in adherence of the ink on the surface of the lithographic printing plate, depositing the ink only to the image area, and then transferring the ink to a printing material, for example, paper.

In order to produce the lithographic printing plate, a lithographic printing plate precursor (PS plate) comprising a hydrophilic support having provided thereon an oleophilic photosensitive resin layer (image-recording layer) has heretofore been broadly used. Ordinarily, the lithographic printing plate is obtained by conducting plate making according to a method of exposing the lithographic printing plate precursor through an original, for example, a lith film, and then while leaving the image-recording layer corresponding to the image area, removing the unnecessary image-recording layer corresponding to the non-image area by dissolving with an alkaline developer or a developer containing an organic solvent thereby revealing the hydrophilic surface of support.

On the other hand, digitalized technique of electronically processing, accumulating and outputting image information using a computer has been popularized in recent years, and various new image-outputting systems responding to the digitalized technique have been put into practical use. Correspondingly, attention has been drawn to a computer-to-plate (CTP) technique of carrying digitalized image information on highly converging radiation, for example, a laser beam and conducting scanning exposure of a lithographic printing plate precursor with the radiation thereby directly preparing a lithographic printing plate without using a lith film. Thus, it is one of the important technical subjects to obtain a lithographic printing plate precursor adaptable to the technique described above.

Further, in the hitherto known plate making process of lithographic printing plate precursor, after exposure, the step of removing the unnecessary image-recording layer by dissolving, for example, with a developer is required. However, it is one of the subjects to save or simplify such an additional wet treatment described above. Particularly, since disposal of liquid wastes discharged accompanying the wet treatment has become a great concern throughout the field of industry in view of the consideration for global environment in recent years, the demand for the solution of the above-described subject has been increased more and more.

As one of simple plate making methods in response to the above-described requirement, a method referred to as on-press development has been proposed wherein a lithographic printing plate precursor having an image-recording layer capable of being removed in its unnecessary areas during a conventional printing process is used and after exposure, the unnecessary area of the image-recording layer is removed on a printing machine to prepare a lithographic printing plate.

Specific methods of the on-press development include, for example, a method of using a lithographic printing plate precursor having an image-recording layer that can be dissolved or dispersed in dampening water, an ink solvent or an emulsion of dampening water and ink, a method of mechanically removing an image-recording layer by contact with rollers or a blanket cylinder of a printing machine, and a method of lowering cohesion of an image-recording layer or adhesion between an image-recording layer and a support upon penetration of dampening water, ink solvent or the like and then mechanically removing the image-recording layer by contact with rollers or a blanket cylinder of a printing machine.

In the invention, unless otherwise indicated particularly, the term "development processing step" means a step of using an apparatus (ordinarily, an automatic developing machine) other than a printing machine and removing an unexposed area in an image-recording layer of a lithographic printing plate precursor upon contact with liquid (for example, ordinarily, an alkaline developer, a developer containing a surfactant or an aqueous solution containing a hydrophilic polymer) thereby revealing a hydrophilic surface of support. The term "on-press development" means a method or a step of removing an unexposed area in an image-recording layer of a lithographic printing plate precursor upon contact with liquid (ordinarily, printing ink and/or dampening water) by using a printing machine thereby revealing a hydrophilic surface of support.

In the simplification of plate making operation as described above, for example, in a dry processing system or a processless system, since the image-recording layer after exposure is not yet fixed by development processing, still has sensitivity and has a risk of generating fog before printing, the image-recording layer capable of being handled in a bright room or under a yellow lump and a light source are preferably used. As such a light source, a semiconductor laser emitting an infrared ray having a wavelength of 760 to 1,200 nm and a solid laser, for example, YAG laser, are extremely useful because those lasers having a large output and a small size are inexpensively available.

The handling property of the lithographic printing plate precursor using such a light source in a bright room or under a yellow lump is fairly improved. However, there is a case of using a mercury lamp emitting light including an ultraviolet ray as the illumination lamp in the steps from plate making to printing and, when the lithographic printing plate precursor of on-press development type is allowed to stand for a long period of time under such a mercury lamp, a problem may arise sometimes in that fog is generated to deteriorate the removability of unexposed area at the on-press development.

In order to overcome the generation of fog, a method of incorporating an ultraviolet absorbing agent into an oxygen-blocking layer provided on an image-recording layer in an alkali-developing type CTP is proposed (see, for example, Patent Document 1). Although this method is an effective technique for a lithographic printing plate precursor which is subjected to an alkali-development processing, the effect becomes insufficient in some cases in the lithographic printing plate precursor of on-press development type because of the deterioration of on-press development property resulting from the incorporation of additive into the oxygen-blocking layer.

As an example of adding an ultraviolet absorbing agent to an image-recording layer, a lithographic printing plate precursor including microcapsules containing an ultraviolet absorbing agent in their walls (see, for example, Patent Document 2). This method is effective in an image-forming layer of heat fusion type or polarity conversion type in view of improvement in the stability of microcapsule. However, since the ultraviolet absorbing agent is not present uniformly throughout the image-recording layer, the method is hardly effective against the fog generation due to a mercury lamp and of little practical use in the lithographic printing plate precursor of on-press development type which is highly sensitive because of utilizing radical polymerization.

Patent Document 1: Japanese Patent 4279656
Patent Document 2: Japanese Patent 4222026

SUMMARY OF THE INVENTION

An object of the present invention is to provide a lithographic printing plate precursor which can prevent the deterioration of on-press development property even when fog is generated in the handling thereof under a mercury lamp.

As a result of the intensive investigations on various compositions for image-recording layer, the inventors have found that a lithographic printing plate precursor which has an image-recording layer containing (A) an infrared absorbing agent, (B) a radical polymerization initiator, (C) a radical polymerizable compound, (D) a polymer compound containing a polyoxyalkylene structure and (E) an ultraviolet absorbing agent and is capable of forming an image by supplying at least one of printing ink and dampening water on a printing machine after imagewise exposure to remove the unexposed area of the image-recording layer is excellent in the handling property under a mercury lamp to complete the present invention. In particular, it has been found that the deterioration of on-press development property can be prevented by introducing as a substituent, an alkyl group having from 8 to 20 carbon atoms into the ultraviolet absorbing agent (E) and further by incorporating the ultraviolet absorbing agent into a polymer fine particle containing a polyoxyalkylene structure.

Specifically, the present invention includes the following items.

1. A lithographic printing plate precursor, comprising a support having thereon an image-recording layer containing (A) an infrared absorbing agent, (B) a radical polymerization initiator, (C) a radical polymerizable compound, (D) a polymer compound containing a polyoxyalkylene structure and (E) an ultraviolet absorbing agent and being capable of forming an image by supplying at least one of printing ink and dampening water on a printing machine after imagewise exposure to remove an unexposed area of the image-recording layer.

2. The lithographic printing plate precursor according to the above 1, wherein the ultraviolet absorbing agent (E) is at least any compound selected from compounds represented by formulae (1), (2) and (4) to (9) shown below:

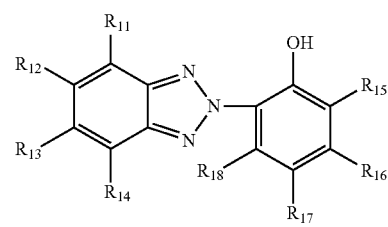

Formula (1)

in formula (1), $R_{11}$ to $R_{18}$ each independently represents a hydrogen atom or a substituent, Formula (2)

in formula (2), $X_{21}$ to $X_{23}$ each independently represents an alkyl group, an aryl group, an alkoxy group, an aryloxy group or a heterocyclic group, provided that at least one of $X_{21}$ to $X_{23}$ represents a group represented by formula (3) shown below:

Formula (3)

in formula (3), $R_{31}$ to $R_{34}$ each independently represents a hydrogen atom or a substituent, Formula (4)

in formula (4), $R_{40}$ to $R_{49}$ each independently represents a hydrogen atom or a substituent, and $X_{41}$ represents —CO— or —COO—, Formula (5)

in formula (5), $R_{51}$ to $R_{55}$ each independently represents a hydrogen atom or a substituent, $X_{51}$ represents a hydrogen atom or an alkyl group, $Y_{51}$ and $Y_{52}$ each independently represents a hydrogen atom, a cyano group, —COOZ$_{51}$, —CONHZ$_{51}$, —COZ$_{51}$, —SO$_2$Z$_{51}$ or —SO$_2$NHZ$_{51}$, and Z$_{51}$ represents a hydrogen atom, an alkyl group or an aryl group, or $Y_{51}$ and $Y_{52}$ may be combined with each other to form a ring,

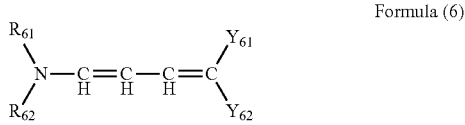

Formula (6)

in formula (6), $R_{61}$ and $R_{62}$ each independently represents a hydrogen atom, an alkyl group or an aryl group, or $R_{61}$ and $R_{62}$ may be combined with each other to form a 5-membered or 6-membered ring, and $Y_{61}$ and $Y_{62}$ have the same meanings as those defined for $Y_{51}$ and $Y_{52}$ in formula (5) respectively,

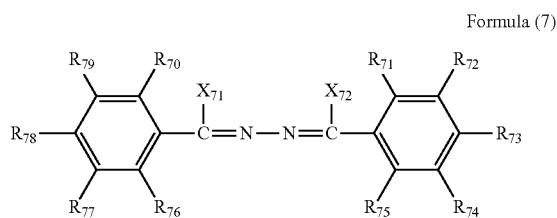

Formula (7)

in formula (7), $R_{70}$ to $R_{79}$ each independently represents a hydrogen atom or a substituent, and $X_{71}$ and $X_{72}$ each independently represents a hydrogen atom, an alkyl group or an aryl group,

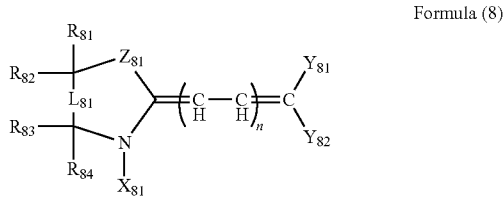

Formula (8)

in formula (8), $R_{81}$ to $R_{84}$ each independently represents a hydrogen atom or a substituent, $L_{81}$ represents a single bond or a double bond, provided that when $L_{81}$ represents a double bond, $R_{81}$ and $R_{84}$ are not present, or $R_{82}$ and $R_{83}$ may be combined with each other to form a ring, $X_{81}$ represents an alkyl group or an aryl group, $Z_{81}$ represents an oxygen atom, a sulfur atom, —N($R_{85}$)— or —C($R_{86}$)($R_{87}$)—, $R_{85}$ represents an alkyl group or an aryl group, $R_{86}$ and $R_{87}$ each independently represents a hydrogen atom or an alkyl group, or $R_{86}$ and $R_{87}$ may be combined with each other to form a ring, $Y_{81}$ and $Y_{82}$ have the same meanings as those defined for $Y_{51}$ and $Y_{52}$ in formula (5) respectively, and n represents 0 or 1,

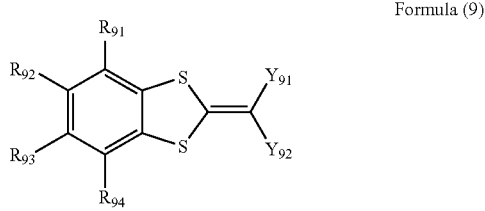

Formula (9)

in Formula (9), $R_{91}$ to $R_{94}$ each independently represents a hydrogen atom or a substituent, and $Y_{91}$ and $Y_{92}$ have the same meanings as those defined for $Y_{51}$ and $Y_{52}$ in formula (5) respectively.

3. The lithographic printing plate precursor according to the above 1 or 2, wherein the ultraviolet absorbing agent (E) contains an alkyl group having from 8 to 20 carbon atoms.

4. The lithographic printing plate precursor according to any one of the above 1 to 3, wherein the ultraviolet absorbing agent (E) is incorporated into a polymer fine particle.

5. The lithographic printing plate precursor according to any one of the above 1 to 4, wherein the polymer compound containing a polyoxyalkylene structure (D) is a polymer fine particle.

6. The lithographic printing plate precursor according to any one of the above 1 to 5, which comprises an oxygen-blocking layer on the image-recording layer.

7. A plate making method of a lithographic printing plate, comprising imagewise exposing the lithographic printing plate precursor according to any one of the above 1 to 6, and then without undergoing a development processing step, removing an unexposed area of the image-recording layer by supplying at least one of printing ink and dampening water on a printing machine to prepare a lithographic printing plate.

According to the present invention, a lithographic printing plate precursor which is excellent in the handling property under a mercury lamp and can achieve a good balance between printing durability and on-press development property can be provided.

DETAILED DESCRIPTION OF THE INVENTION

Lithographic Printing Plate Precursor

The lithographic printing plate precursor according to the invention comprises a support having thereon an image-recording layer containing (A) an infrared absorbing agent, (B) a radical polymerization initiator, (C) a radical polymerizable compound, (D) a polymer compound containing a polyoxyalkylene structure and (E) an ultraviolet absorbing agent.

The lithographic printing plate precursor according to the invention is a negative type lithographic printing plate precursor utilizing radical polymerization and a lithographic printing plate precursor of on-press development type capable of forming an image by supplying at least one of printing ink and dampening water on a printing machine after imagewise exposure to remove the unexposed area of the image-recording layer.

<Ultraviolet Absorbing Agent>

The ultraviolet absorbing agent according to the invention indicates ultraviolet absorbing agents described, for example, in *Jitsuyo Plastic Yogo Jiten* (*Practical Plastic Term Dictionary*), third edition, published by Plastics Age Co., Ltd. (Sep. 10, 1989) and specifically a compound which does not substantially have absorption in an visible range, adsorbs an ultraviolet ray to efficiently disperse as heat energy and is stable to light.

As a chromophore of the ultraviolet absorbing agent preferably used in the invention, any known chromophore, for example, a benzotriazole compound, a triazine compound, a benzophenone compound, a salicylic acid compound, a cinnamic acid ester compound, an azole compound, a benzodithiol compound, an azo compound or an azine compound may be used. The ultraviolet absorbing agent is preferably at least any compound selected from compounds having structures represented by formulae (1), (2) and (4) to (9) shown below.

The ultraviolet absorbing agent represented by each of formulae (1), (2) and (4) to (9) will be described below.

<Compound of Formula (1)>
The compound of formula (1) is described in detail below.

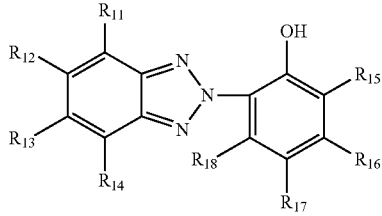

Formula (1)

In formula (1), $R_{11}$ to $R_{18}$ each independently represents a hydrogen atom or a substituent.

$R_{11}$ to $R_{18}$ are described in detail below. $R_{11}$ to $R_{18}$ each independently represents a hydrogen atom or a substituent. Examples of the substituent include an alkyl group having from 1 to 40 carbon atoms (for example, a methyl group, an ethyl group, a propyl group, a butyl group, a pentyl group, a hexyl group, a heptyl group, an octyl group, a nonyl group, a decyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclopentyl group, a cyclohexyl group, 1-adamantyl, a 2-norbornyl group, a benzyl group or an allyl group), an alkenyl group having from 2 to 40 carbon atoms (for example, a vinyl group, a 1-propenyl group, a 1-butenyl group, a 1-methyl-1-propenyl group, a 1-cyclopentenyl group or 1-cyclohexenyl group), an alkynyl group having from 2 to 40 carbon atoms (for example, an ethynyl group, a 1-propynyl group, a 1-butynyl group or a 1-octynyl group), an aryl group having from 6 to 40 carbon atoms (for example, a phenyl group, a 2-methylphenyl group, a 3-methylphenyl group, a 4-methylphenyl group, a 3,5-dimethylphenyl group, a 2,4,6-trimethylphenyl group, a 2-methoxyphenyl group, a 4-methoxyphenyl group, a 2-chlorophenyl group, a 4-chlorophenyl group, a 1-naphthyl group or 2-naphthyl group), a heterocyclic group, a halogen atom (for example, —F, —Br, —Cl or —I), a hydroxy group, an alkoxy group, an aryloxy group, an alkylcarbonyloxy group, an arylcarbonyloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group and its conjugate base group, an alkoxycarbonyl group, an aryloxycarbonyl group, an N-alkylaminocarbonyl group, an N,N-dialkylaminocarbonyl group, an N-arylaminocarbonyl group, an N,N-diarylaminocarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and its conjugate base group, an alkoxysulfonyl group, an aryloxysulfonyl group, a sulfinamoyl group, an N-alkylsulfinamoyl group, an N,N-dialkylsulfinamoyl group, an N-aryl-sulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and its conjugate base group, an N-alkylsulfonylsulfamoyl group (—$SO_2NHSO_2$(alkyl)) and its conjugate base group, an N-arylsulfonylsulfamoyl group (—$SO_2NHSO_2$(aryl)) and its conjugate base group, an N-alkylsulfonylcarbamoyl group (—$CONHSO_2$(alkyl)) and its conjugate base group, an N-arylsulfonylcarbamoyl group (—$CONHSO_2$(aryl)) and its conjugate base group, an alkoxysilyl group (—Si(Oalkyl)$_3$), an aryloxysilyl group (—Si(Oaryl)$_3$), a hydroxysilyl group (—Si(OH)$_3$) and its conjugate base group, a phosphono group (—$PO_3H_2$) and its conjugate base group, a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3H$(alkyl)) and its conjugate base group, a monoarylphosphono group (—$PO_3H$(aryl)) and its conjugate base group, a phosphonooxy group (—$OPO_3H_2$) and its conjugate base group, a dialkylphosphonooxy group (—$OPO_3$(alkyl)$_2$), a diarylphosphonooxy group (—$OPO_3$(aryl)$_2$), an alkylarylphosphonooxy group (—$OPO_3$(alkyl)(aryl)), a monoalkylphosphonooxy group (—$OPO_3H$(alkyl)) and its conjugate base group, a monoarylphosphonooxy group (—$OPO_3H$(aryl)) and its conjugate base group, a cyano group, a nitro group, a dialkylboryl group (—B(alkyl)$_2$), a diarylboryl group (—B(aryl)$_2$), an alkylarylboryl group (—B(alkyl)(aryl)), a dihydroxyboryl group (—B(OH)$_2$) and its conjugate base group, an alkylhydroxyboryl group (—B(alkyl)(OH)) and its conjugate base group, and an arylhydroxyboryl group (—B(aryl)(OH)) and its conjugate base group.

The above-described groups may further be substituted and examples of the substituent include those described for $R_{11}$ to $R_{18}$ above.

Preferable examples of $R_{11}$ to $R_{18}$ in formula (1) include a hydrogen atom, an alkyl group, a halogen atom (for example, —F, —Br, —Cl or —I), a hydroxy group, an alkoxy group, an aryloxy group, an alkylcarbonyloxy group, an arylcarbonyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, a sulfo group (—$SO_3H$) and its conjugate base group, a carboxyl group and its conjugate base group, an alkylsulfoxy group, an arylsulfoxy group, a phosphonooxy group (—$OPO_3H_2$) and its conjugate base group, a dialkylphosphonooxy group (—$OPO_3$(alkyl)$_2$), a diarylphosphonooxy group (—$OPO_3$(aryl)$_2$), an alkylarylphosphonooxy group (—$OPO_3$(alkyl)(aryl)), a monoalkylphosphonooxy group (—$OPO_3H$(alkyl)) and its conjugate base group, and a monoarylphosphonooxy group (—$OPO_3H$(aryl)) and its conjugate base group.

More preferable examples of $R_{11}$ to $R_{18}$ include a hydrogen atom, an alkyl group, a halogen atom (for example, —F, —Br, —Cl or —I), a hydroxy group, an alkoxy group, an aryloxy group, an alkylcarbonyloxy group, an arylcarbonyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a sulfo group (—$SO_3H$) and its conjugate base group, and a carboxyl group and its conjugate base group.

Still more preferable examples of $R_{11}$ to $R_{18}$ include a hydrogen atom, an alkyl group, a halogen atom (for example, —F, —Br, —Cl or —I), a hydroxy group, an alkoxy group, an aryloxy group, an alkylcarbonyloxy group, an arylcarbonyloxy group, a carbamoyloxy group, an N-alkylcarbamoyloxy group, an N-arylcarbamoyloxy group, a sulfo group (—$SO_3H$) and its conjugate base group, and a carboxyl group and its conjugate base group.

From the standpoint of preventing the deterioration of on-press development property (without irradiation of a mercury lamp) by adding the ultraviolet absorbing agent, at least one of $R_{11}$ to $R_{18}$ is preferably a group containing an alkyl group having from 4 to 40 carbon atoms. The terminology "a group containing an alkyl group" as used herein includes not only a case where one of $R_{11}$ to $R_{18}$ is an alkyl group having from 4 to 40 carbon atoms, but also a case where one of $R_{11}$ to $R_{18}$ is a group containing an alkyl moiety (for example, an alkoxy group) having from 4 to 40 carbon atoms. The alkyl group is preferably a straight-chain or branched structure. The alkyl group has more preferably from 6 to 30 carbon atoms, and particularly preferably from 8 to 20 carbon atoms.

Preferable examples of the compound represented by formula (1) are set for the below, but the invention should not be construed as being limited thereto.

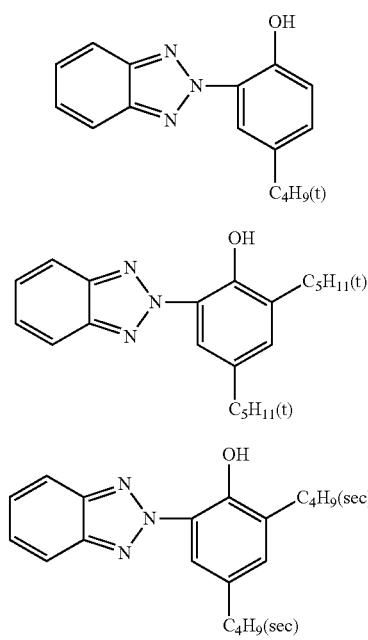

I-1

I-2

I-3

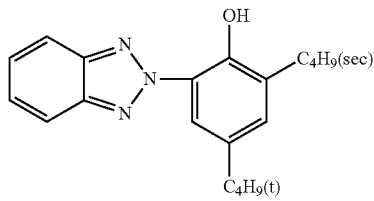

I-4

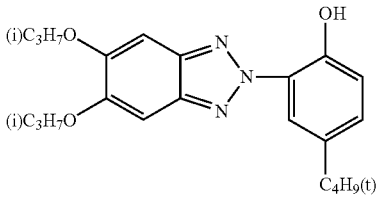

I-5

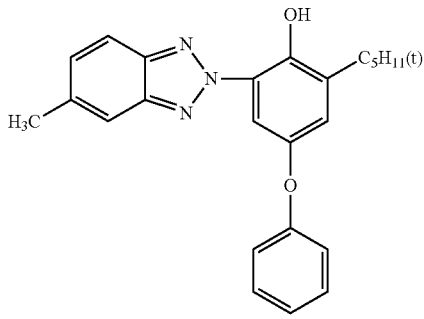

I-6

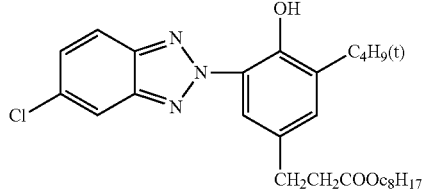

I-7

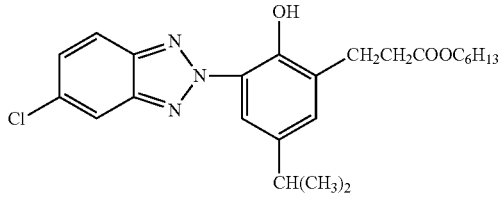

I-8

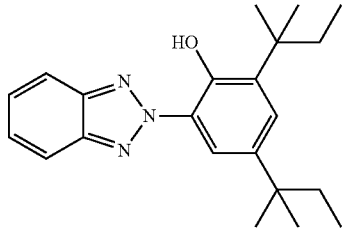

I-9

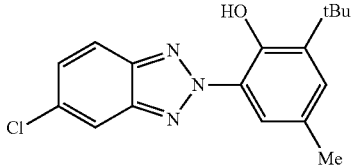

I-10

-continued

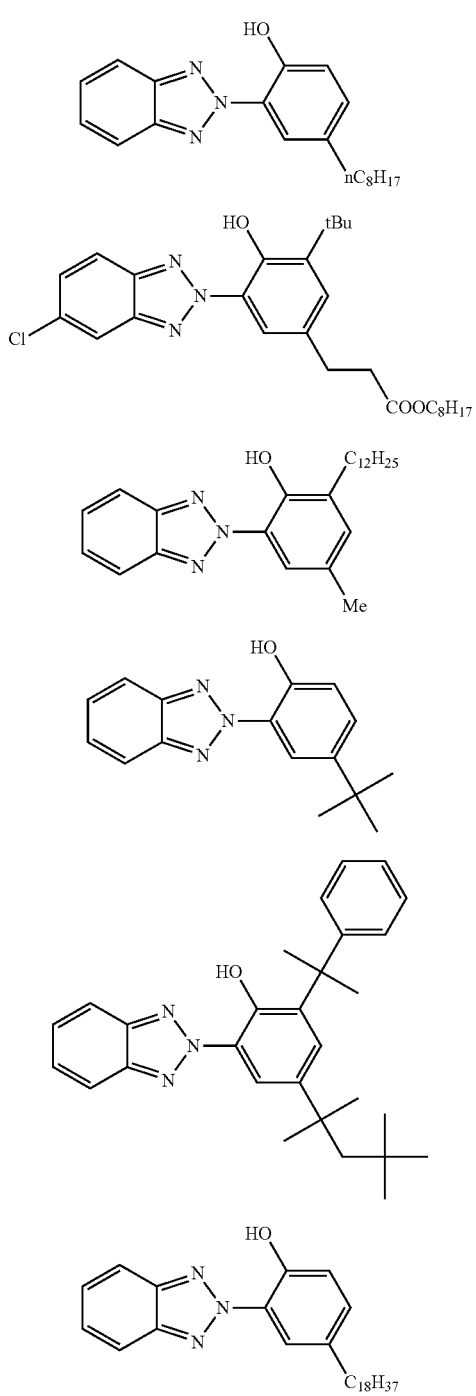

I-11

I-12

I-13

I-14

I-15

I-16

<Compound of Formula (2)>

The compound of formula (2) is described in detail below.

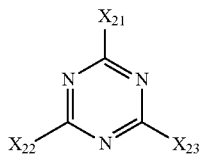

Formula (2)

In formula (2), $X_{21}$ to $X_{23}$ each independently represents an alkyl group, an aryl group, an alkoxy group, an aryloxy group or a heterocyclic group, and these groups may have a substituent, provided that at least one of $X_{21}$ to $X_{23}$ represents a group represented by formula (3) shown below:

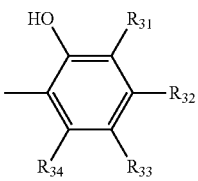

Formula (3)

In formula (3), $R_{31}$ to $R_{34}$ each independently represents a hydrogen atom or a substituent.

Examples of the group represented by $X_{21}$ to $X_{23}$ other than the group represented by formula (3) include an alkyl group having from 1 to 40 carbon atoms (for example, a methyl group, an ethyl group, a propyl group, a butyl group, a pentyl group, a hexyl group, a heptyl group, an octyl group, a nonyl group, a decyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclopentyl group, a cyclohexyl group, 1-adamantyl, a 2-norbornyl group, a benzyl group or an allyl group), an aryl group having from 6 to 40 carbon atoms (for example, a phenyl group, a 2-methylphenyl group, a 3-methylphenyl group, a 4-methylphenyl group, a 3,5-dimethylphenyl group, a 2,4,6-trimethylphenyl group, a 2-methoxyphenyl group, a 4-methoxyphenyl group, a 2-chlorophenyl group, a 4-chlorophenyl group, a 1-naphthyl group or 2-naphthyl group), an alkoxy group having from 1 to 40 carbon atoms (for example, a methoxy group, an ethoxy group, a propyloxy group, a butyloxy group, a pentyloxy group, a hexyloxy group, a heptyloxy group, an octyloxy group, a nonyloxy group, a decyloxy group, an 2-propyloxy group, an isobutyloxy group, a sec-butyloxy group, a tert-butyloxy group, an isopentyloxy group, a neopentyloxy group, a 1-methylbutyloxy group, an isohexyloxy group, a 2-ethylhexyloxy group, a 2-methylhexyloxy group, a cyclopentyloxy group, a cyclohexyloxy group, 1-adamantyloxy, a 2-norbornyoxy group, a benzyloxy group or an allyloxy group), an aryloxy group having from 6 to 40 carbon atoms (for example, a phenoxy group, a 2-methylphenoxy group, a 3-methylphenoxy group, a 4-methylphenoxy group, a 3,5-dimethylphenoxy group, a 2,4,6-trimethylphenoxy group, a 2-methoxyphenoxy group, a 4-methoxyphenoxy group, a 2-chlorophenoxy group, a 4-chlorophenoxy group, a 1-naphthyloxy group or 2-naphthyloxy group), and a heterocyclic group (for example, a 2-pyridyl group, a 4-pyridyl group or a morpholinyl group.

The above-described groups may further be substituted and examples of the substituent include those described for $R_{11}$ to $R_{18}$ in formula (1).

When $R_{31}$ to $R_{34}$ in formula (3) each represents a substituent, examples of the substituent include the preferable examples of the substituent represented by $R_{11}$ to $R_{18}$ in formula (1).

From the standpoint of preventing the deterioration of on-press development property (without irradiation of a mercury lamp) by adding the ultraviolet absorbing agent, at least one of $X_{21}$ to $X_{23}$ and $R_{31}$ to $R_{34}$ is preferably a group containing an alkyl group having from 4 to 40 carbon atoms. The alkyl group is preferably a straight-chain or branched structure. The alkyl group has more preferably from 6 to 30 carbon atoms, and particularly preferably from 8 to 20 carbon atoms.

Preferable examples of the compound represented by formula (2) are set for the below, but the invention should not be construed as being limited thereto.
VII-1
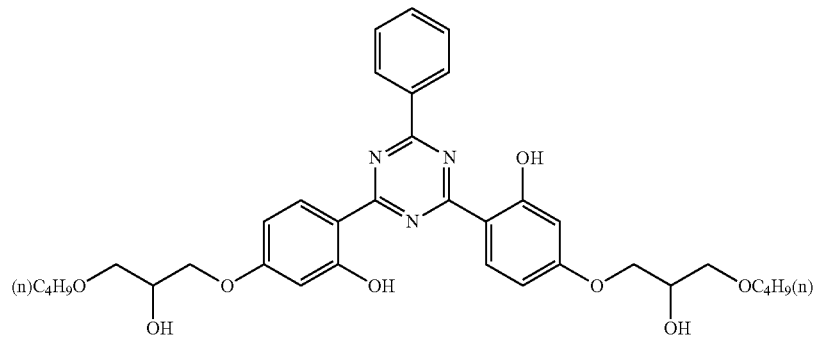
VII-2
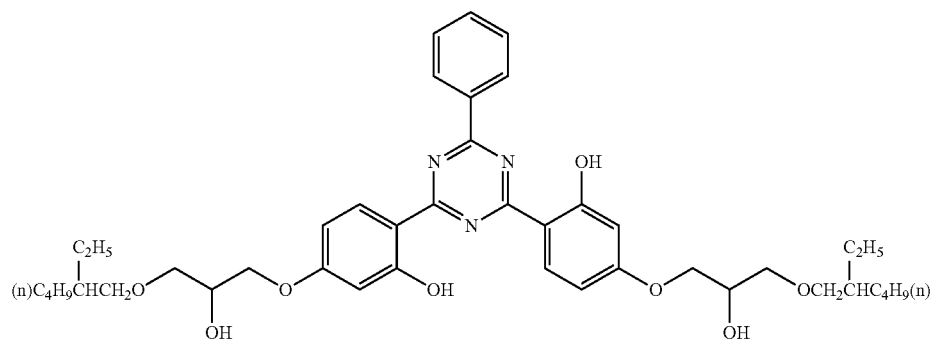
VII-3
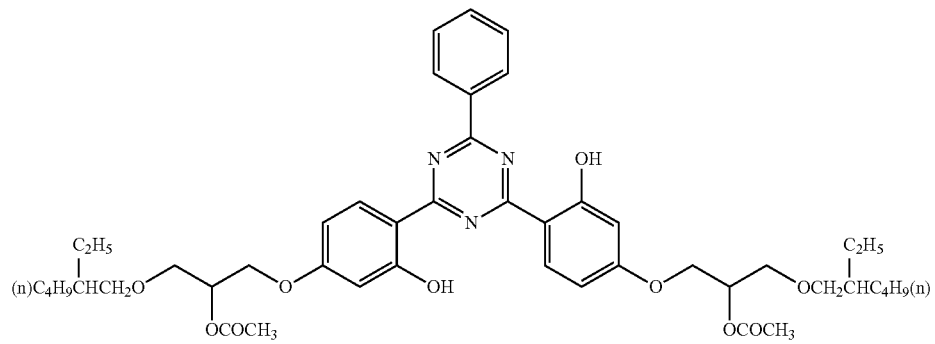
VII-4
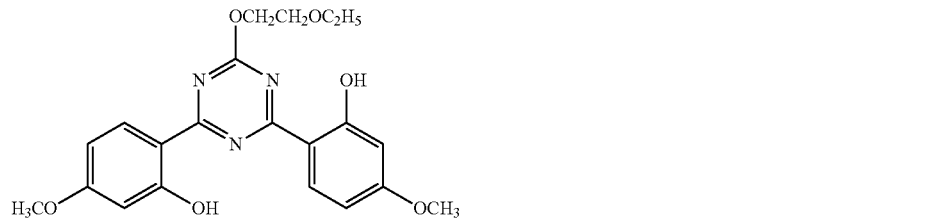
VII-5
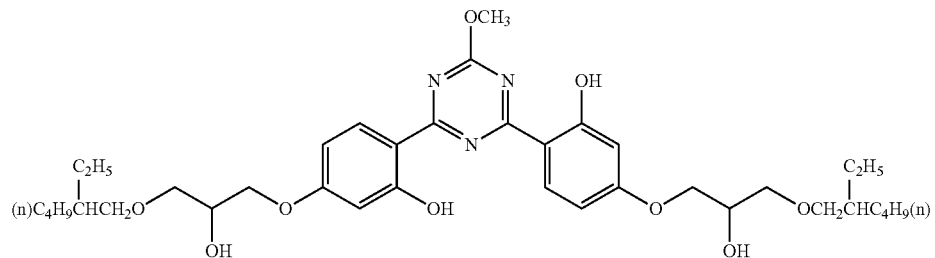

-continued
VII-6
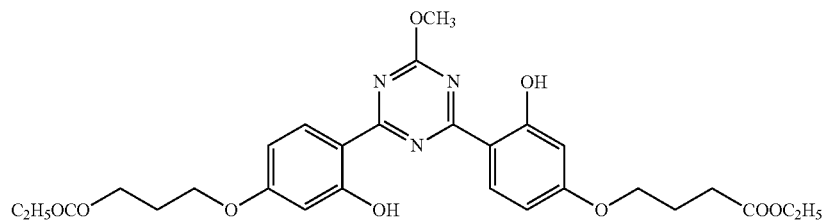
VII-7
VII-8
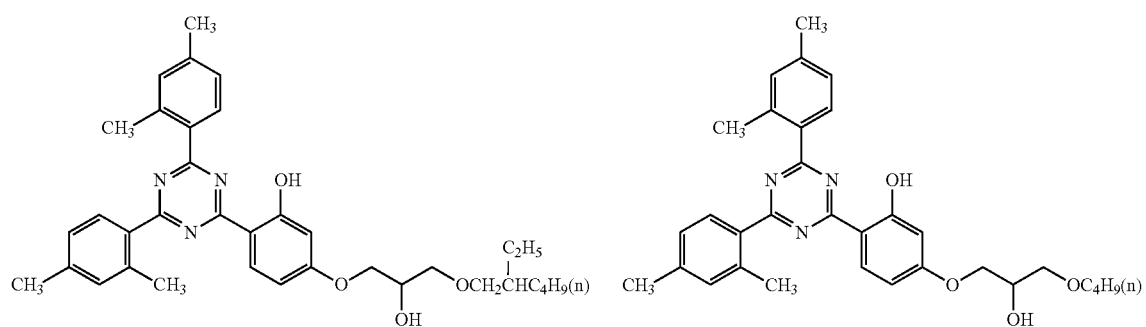
VII-10
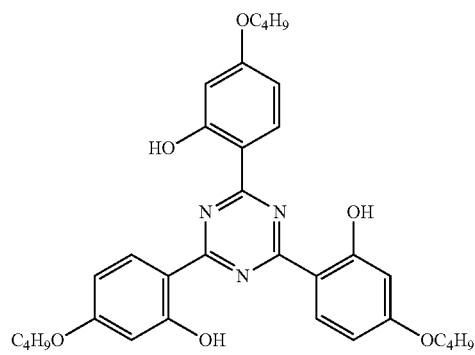
VII-11
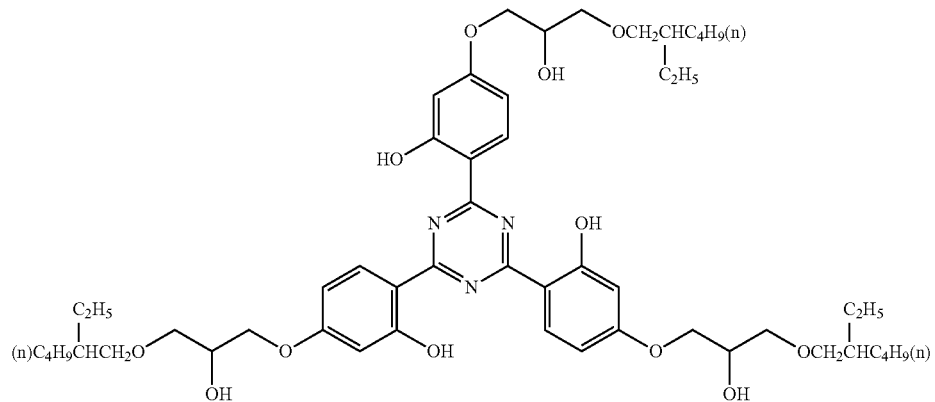

-continued
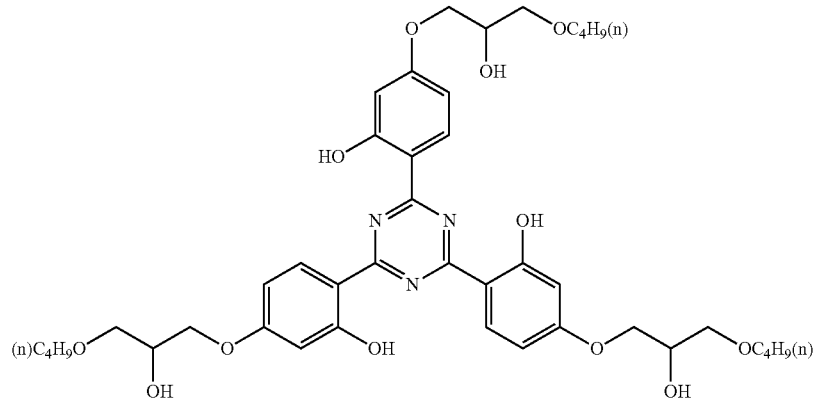
VII-12
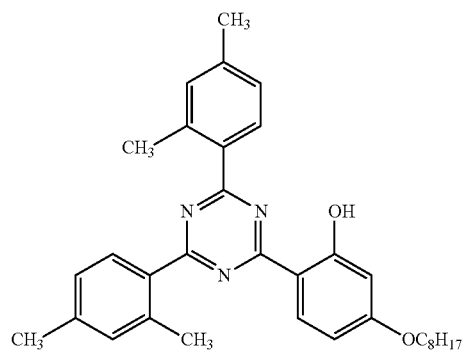
VII-13
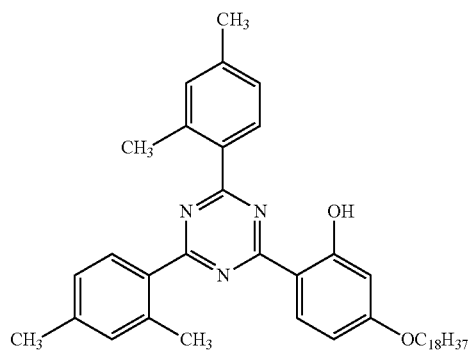
VII-14
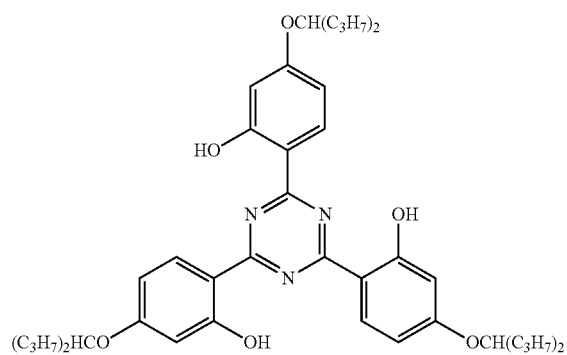
VII-15
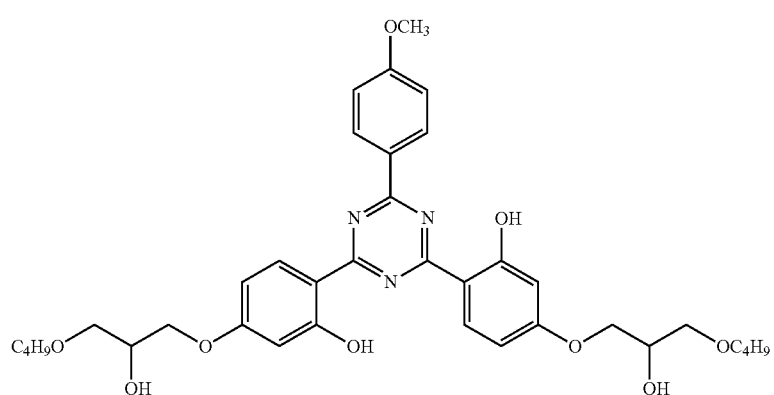
VII-16

-continued
VII-17
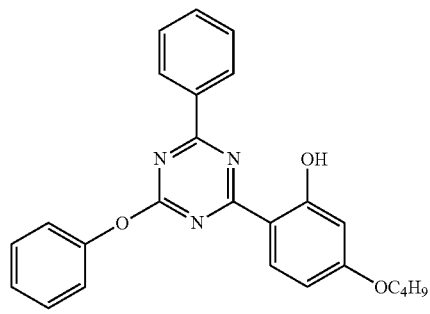
VII-18
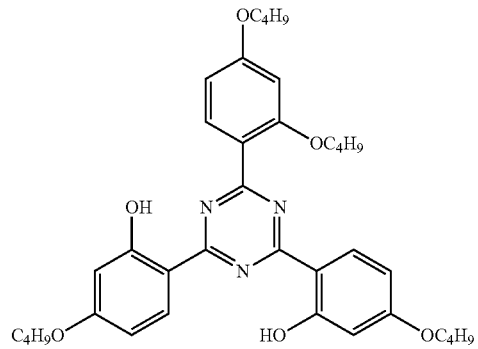
VII-19
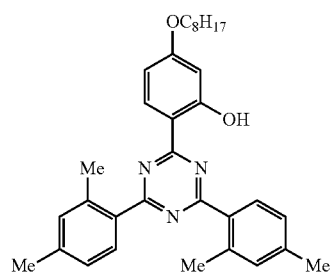
VII-20
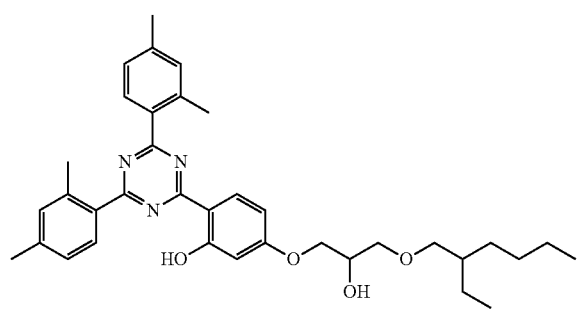
VII-21
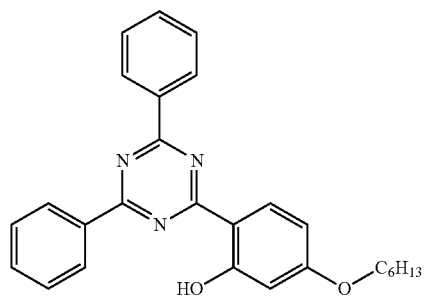
VII-22
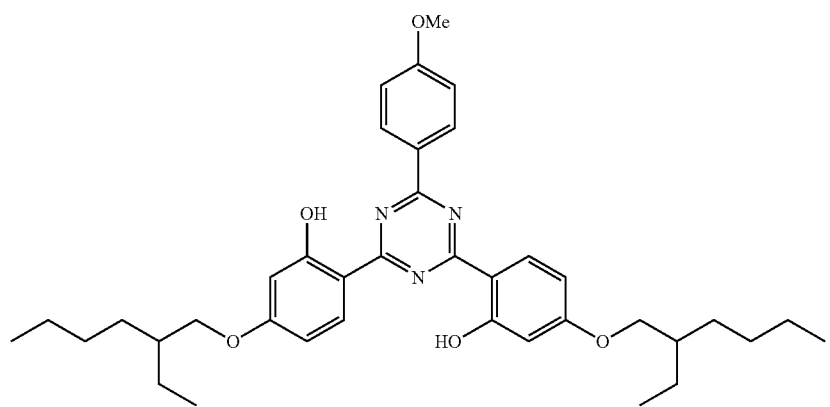

VII-23
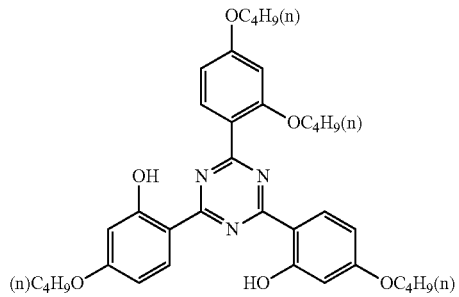

VII-24
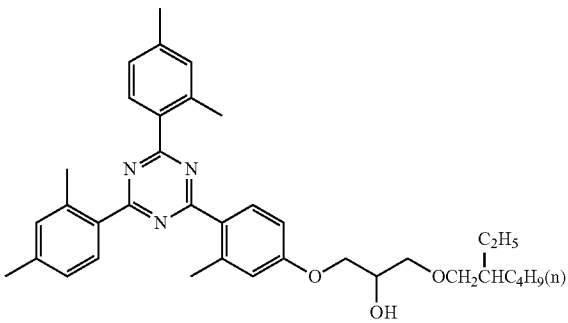

VII-25
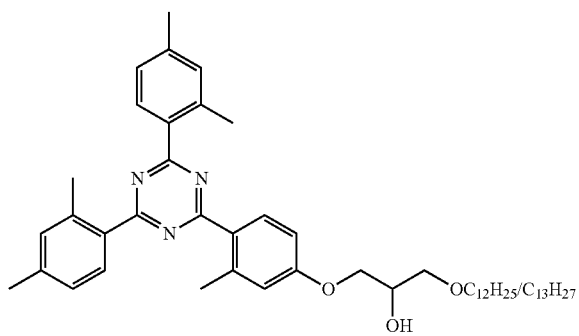

VII-26

VII-27
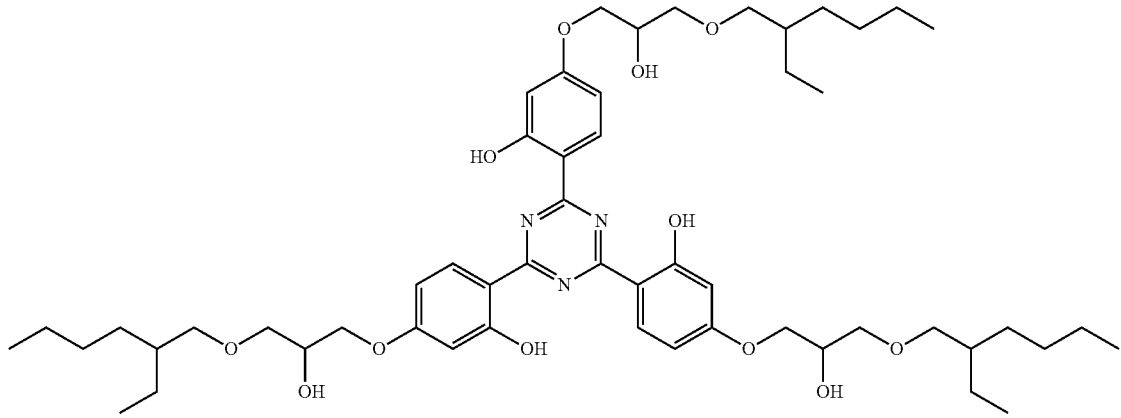

<Compound of Formula (4)>

The compound of formula (4) is described in detail below.

Formula (4)
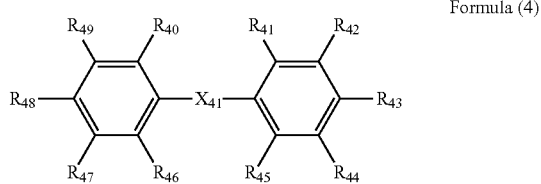

In formula (4), $R_{40}$ to $R_{49}$ each independently represents a hydrogen atom or a substituent. Examples of the substituent include those described for $R_{11}$ to $R_{18}$ in formula (1). $X_{41}$ represents —CO— or —COO—.

From the standpoint of preventing the deterioration of on-press development property (without irradiation of a mercury lamp) by adding the ultraviolet absorbing agent, at least one of $R_{40}$ to $R_{49}$ is preferably a group containing an alkyl group having from 4 to 40 carbon atoms. The alkyl group is preferably a straight-chain or branched structure. The alkyl group has more preferably from 6 to 30 carbon atoms, and particularly preferably from 8 to 20 carbon atoms.

Preferable examples of the compound represented by formula (4) are set for the below, but the invention should not be construed as being limited thereto.

III-1
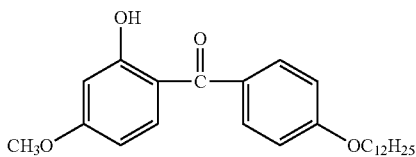

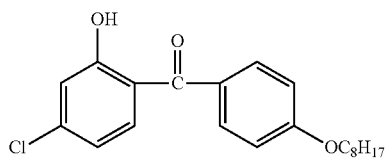
III-2

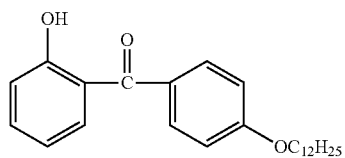
III-3

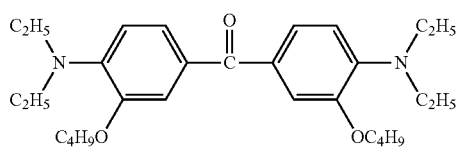
III-4

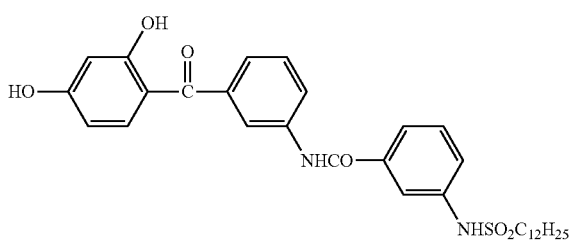
III-5

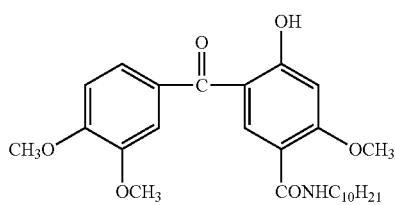
III-6

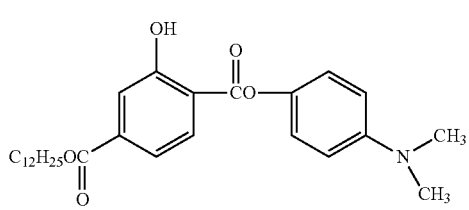
III-7

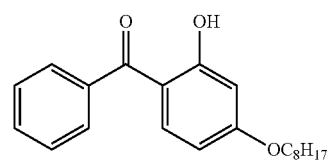
III-8

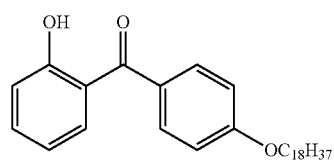
III-9

<Compound of Formula (5)>

The compound of formula (5) is described in detail below.

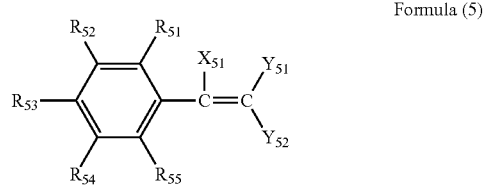

Formula (5)

In formula (5), $R_{51}$ to $R_{55}$ each independently represents a hydrogen atom or a substituent. Examples of the substituent include those described for $R_{11}$ to $R_{18}$ in formula (1).

$X_{51}$ represents a hydrogen atom or an alkyl group, $Y_{51}$ and $Y_{52}$ each independently represents a hydrogen atom, a cyano group, —$COOZ_{51}$, —$CONHZ_{51}$, —$COZ_{51}$, —$SO_2Z_{51}$ or —$SO_2NHZ_{51}$, and $Z_{51}$ represents a hydrogen atom, an alkyl group or an aryl group, or $Y_{51}$ and $Y_{52}$ may be combined with each other to form a ring.

Preferable examples of the alkyl group represented by $X_{51}$ and the alkyl group or aryl group represented by $Z_{51}$ include those of the alkyl group or aryl group described for $R_{11}$ to $R_{18}$ in formula (1).

From the standpoint of preventing the deterioration of on-press development property (without irradiation of a mercury lamp) by adding the ultraviolet absorbing agent, at least one of $X_{51}$, $Y_{51}$, $Y_{52}$ and $R_{51}$ to $R_{55}$ is preferably a group containing an alkyl group having from 4 to 40 carbon atoms. The alkyl group is preferably a straight-chain or branched structure. The alkyl group has more preferably from 6 to 30 carbon atoms, and particularly preferably from 8 to 20 carbon atoms.

Preferable examples of the compound represented by formula (5) are set for the below, but the invention should not be construed as being limited thereto.

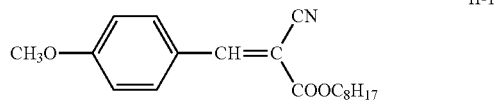
II-1

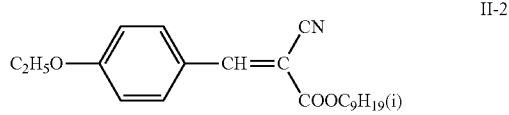
II-2

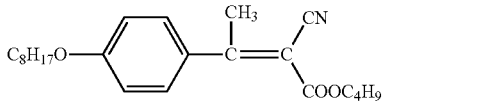
II-3

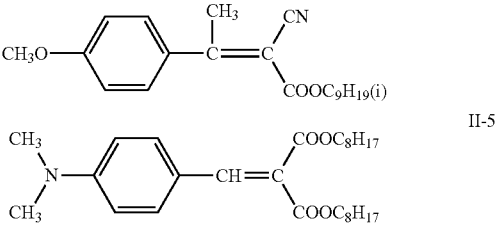
II-4

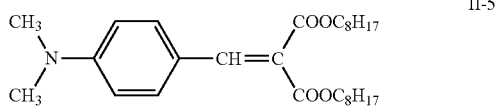
II-5

-continued

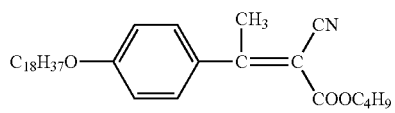

II-6

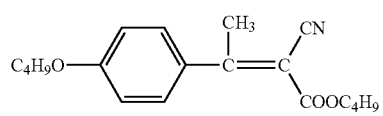

II-7

<Compound of Formula (6)>
The compound of formula (6) is described in detail below.

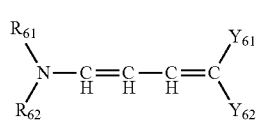

Formula (6)

In formula (6), $R_{61}$ and $R_{62}$ each independently represents a hydrogen atom, an alkyl group or an aryl group. Preferable examples of the alkyl group or aryl group represented by $R_{61}$ and $R_{62}$ include those of the alkyl group or aryl group described for $R_{11}$ to $R_{18}$ in formula (1). Or $R_{61}$ and $R_{62}$ may be combined with each other to form a 5-membered or 6-membered ring. $Y_{61}$ and $Y_{62}$ have the same meanings as those defined for $Y_{51}$ and $Y_{52}$ in formula (5) respectively.

From the standpoint of preventing the deterioration of on-press development property (without irradiation of a mercury lamp) by adding the ultraviolet absorbing agent, at least one of $Y_{61}$, $Y_{62}$, $R_{61}$ and $R_{62}$ is preferably a group containing an alkyl group having from 4 to 40 carbon atoms. The alkyl group is preferably a straight-chain or branched structure. The alkyl group has more preferably from 6 to 30 carbon atoms, and particularly preferably from 8 to 20 carbon atoms.

Preferable examples of the compound represented by formula (6) are set for the below, but the invention should not be construed as being limited thereto.

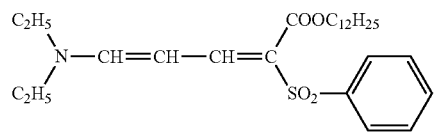

IV-1

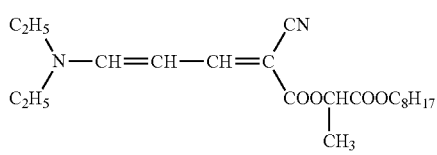

IV-2

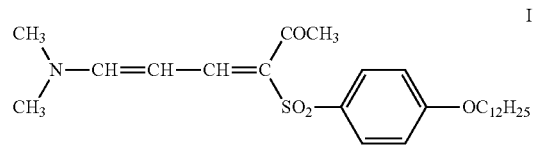

IV-3

-continued

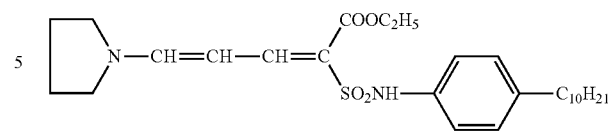

IV-4

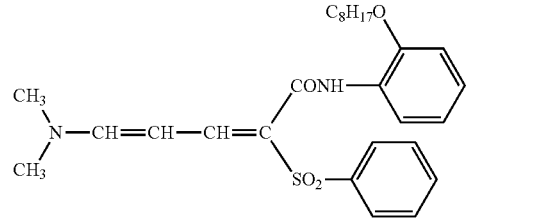

IV-5

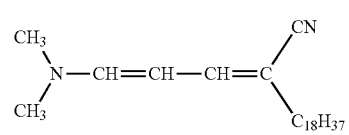

IV-6

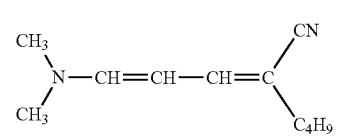

IV-7

<Compound of Formula (7)>
The compound of formula (7) is described in detail below.

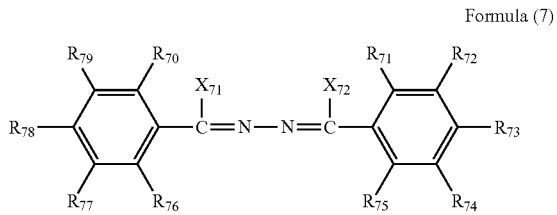

Formula (7)

In formula (7), $R_{70}$ to $R_{79}$ each independently represents a hydrogen atom or a substituent. Examples of the substituent include those described for $R_{11}$ to $R_{18}$ in formula (1). $X_{71}$ and $X_{72}$ each independently represents a hydrogen atom, an alkyl group or an aryl group. Preferable examples of the alkyl group or aryl group represented by $X_{71}$ and $X_{72}$ include those of the alkyl group or aryl group described for $R_{11}$ to $R_{18}$ in formula (1).

From the standpoint of preventing the deterioration of on-press development property (without irradiation of a mercury lamp) by adding the ultraviolet absorbing agent, at least one of $X_{71}$, $X_{72}$ and $R_{70}$ to $R_{79}$ is preferably a group containing an alkyl group having from 4 to 40 carbon atoms. The alkyl group is preferably a straight-chain or branched structure. The alkyl group has more preferably from 6 to 30 carbon atoms, and particularly preferably from 8 to 20 carbon atoms.

Preferable examples of the compound represented by formula (7) are set for the below, but the invention should not be construed as being limited thereto.

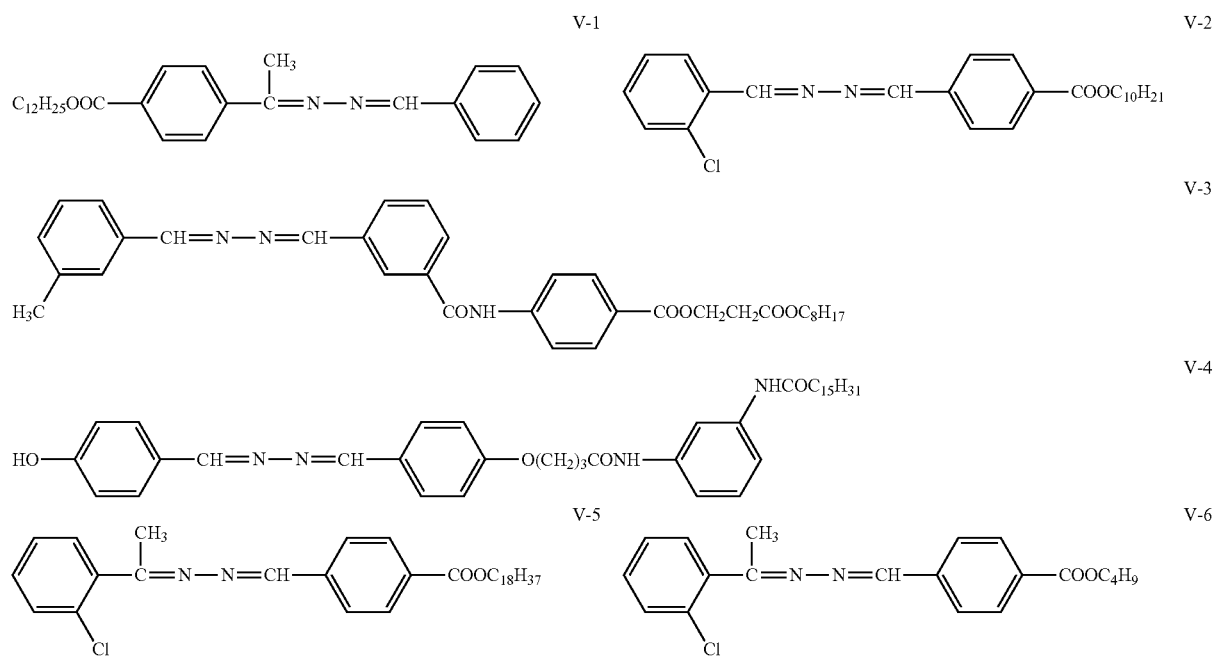

<Compound of Formula (8)>
The compound of formula (8) is described in detail below.

Preferable examples of the compound represented by formula (8) are set for the below, but the invention should not be construed as being limited thereto.

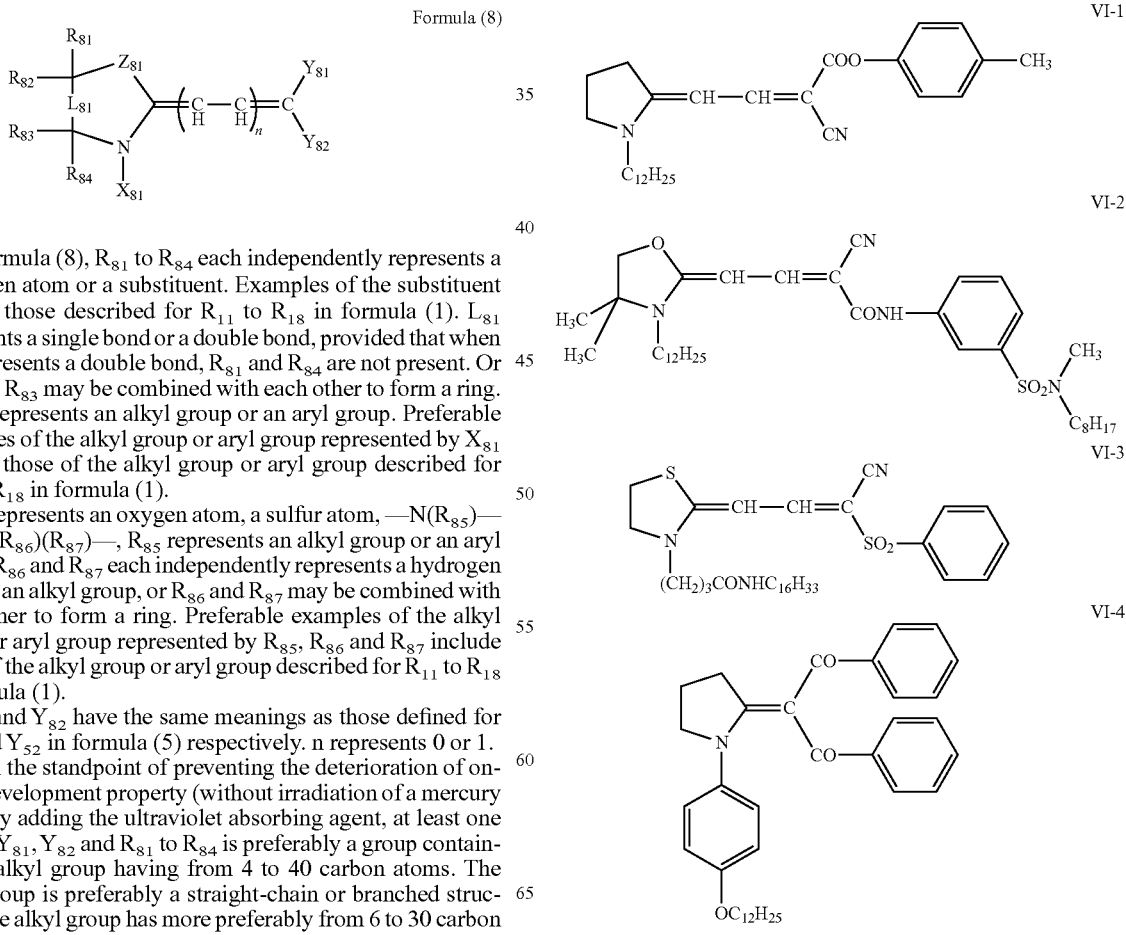

In formula (8), $R_{81}$ to $R_{84}$ each independently represents a hydrogen atom or a substituent. Examples of the substituent include those described for $R_{11}$ to $R_{18}$ in formula (1). $L_{81}$ represents a single bond or a double bond, provided that when $L_{81}$ represents a double bond, $R_{81}$ and $R_{84}$ are not present. Or $R_{82}$ and $R_{83}$ may be combined with each other to form a ring.

$X_{81}$ represents an alkyl group or an aryl group. Preferable examples of the alkyl group or aryl group represented by $X_{81}$ include those of the alkyl group or aryl group described for $R_{11}$ to $R_{18}$ in formula (1).

$Z_{81}$ represents an oxygen atom, a sulfur atom, —N($R_{85}$)— or —C($R_{86}$)($R_{87}$)—, $R_{85}$ represents an alkyl group or an aryl group, $R_{86}$ and $R_{87}$ each independently represents a hydrogen atom or an alkyl group, or $R_{86}$ and $R_{87}$ may be combined with each other to form a ring. Preferable examples of the alkyl group or aryl group represented by $R_{85}$, $R_{86}$ and $R_{87}$ include those of the alkyl group or aryl group described for $R_{11}$ to $R_{18}$ in formula (1).

$Y_{81}$ and $Y_{82}$ have the same meanings as those defined for $Y_{51}$ and $Y_{52}$ in formula (5) respectively. n represents 0 or 1.

From the standpoint of preventing the deterioration of on-press development property (without irradiation of a mercury lamp) by adding the ultraviolet absorbing agent, at least one of $X_{81}$, $Y_{81}$, $Y_{82}$ and $R_{81}$ to $R_{84}$ is preferably a group containing an alkyl group having from 4 to 40 carbon atoms. The alkyl group is preferably a straight-chain or branched structure. The alkyl group has more preferably from 6 to 30 carbon atoms, and particularly preferably from 8 to 20 carbon atoms.

-continued

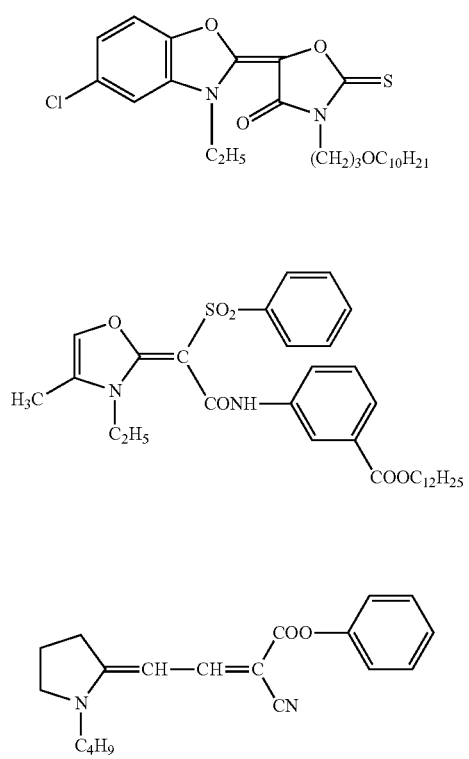

VI-5

VI-6

VI-7

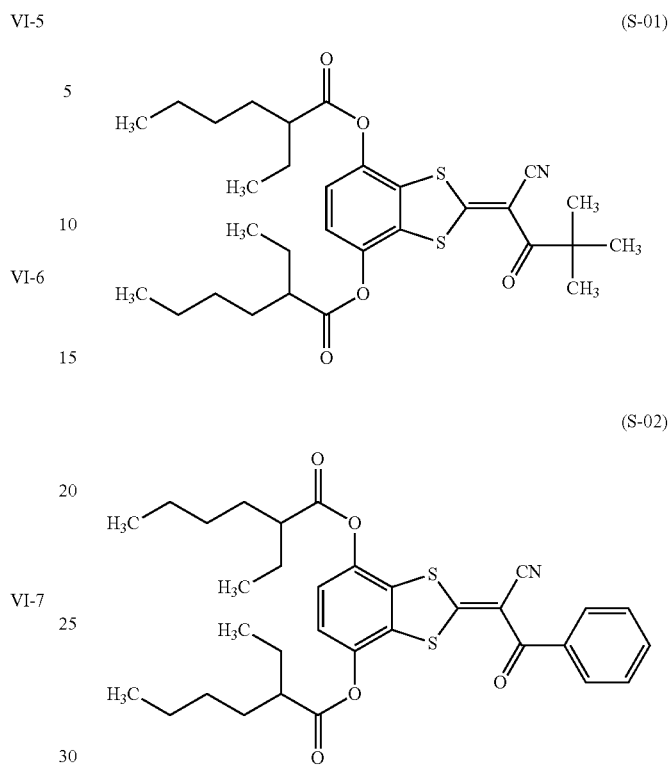

(S-01)

(S-02)

(S-03)

<Compound of Formula (9)>

The compound of formula (9) is described in detail below.

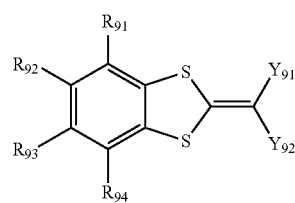

Formula (9)

In Formula (9), $R_{91}$ to $R_{94}$ each independently represents a hydrogen atom or a substituent. When any one of $R_{91}$ to $R_{94}$ represents a substituent, examples of the substituent include those described for $R_{11}$ to $R_{18}$ in formula (1). $Y_{91}$ and $Y_{92}$ have the same meanings as those defined for $Y_{51}$ and $Y_{52}$ in formula (5) respectively.

From the standpoint of preventing the deterioration of on-press development property (without irradiation of a mercury lamp) by adding the ultraviolet absorbing agent, at least one of $Y_{91}$, $Y_{92}$ and $R_{91}$ to $R_{94}$ is preferably a group containing an alkyl group having from 4 to 40 carbon atoms. The alkyl group is preferably a straight-chain or branched structure. The alkyl group has more preferably from 6 to 30 carbon atoms, and particularly preferably from 8 to 20 carbon atoms.

Preferable examples of the compound represented by formula (9) are set for the below, but the invention should not be construed as being limited thereto.

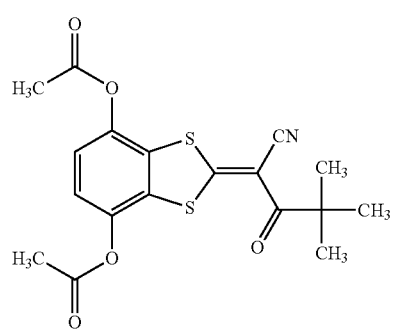

(S-04)

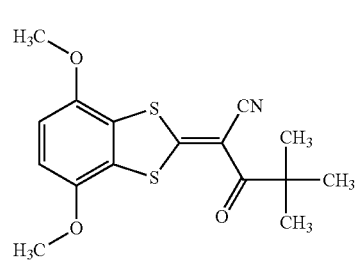

(S-05)

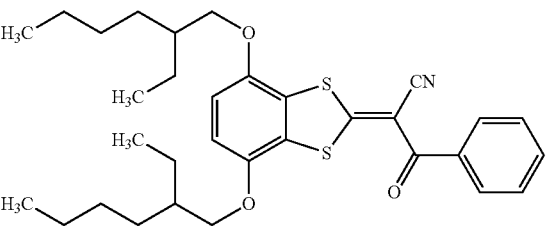

(S-06)
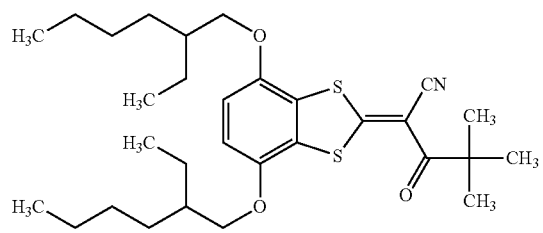
(S-07)
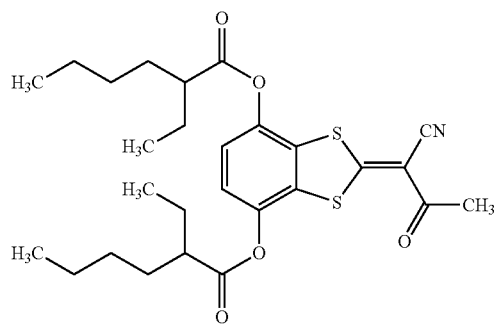
(S-08)
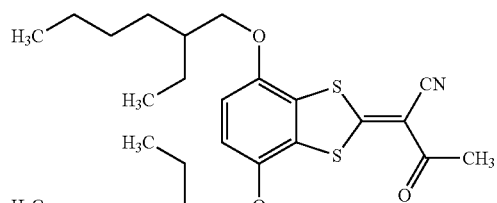
(S-09)
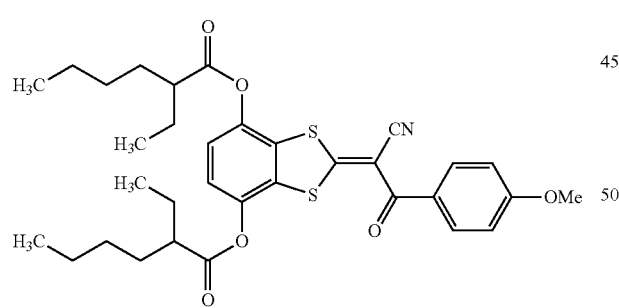
(S-10)
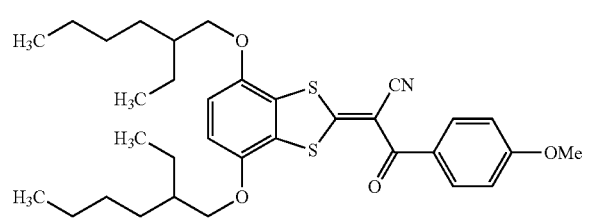
(S-11)
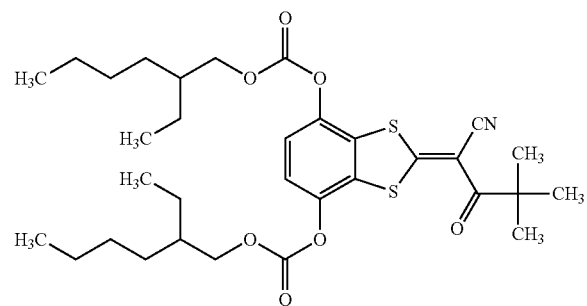
(S-12)
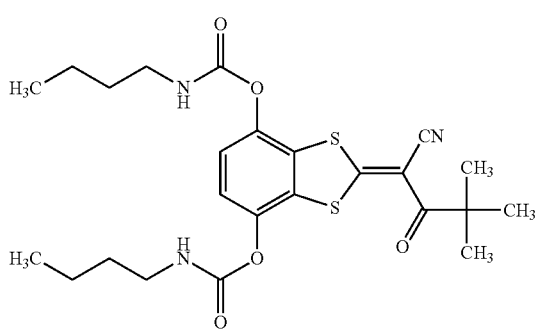
(S-13)
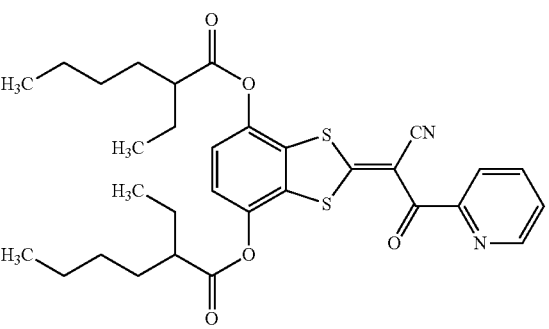
(S-14)
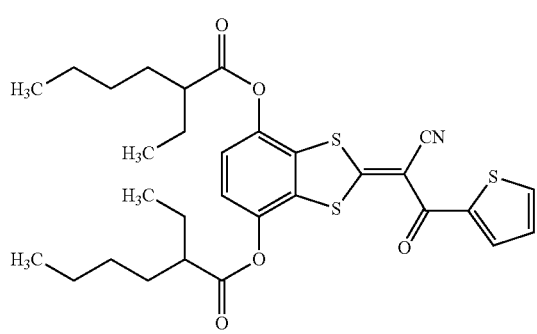

(S-15)
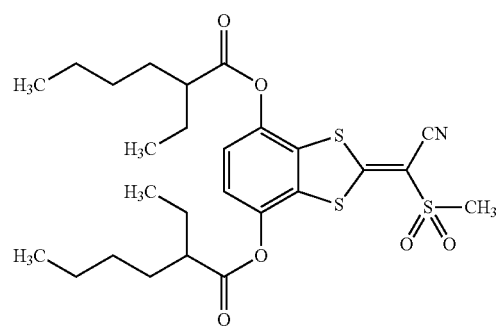
(S-16)
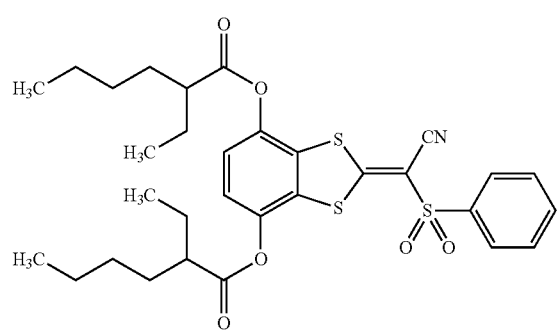
(S-17)
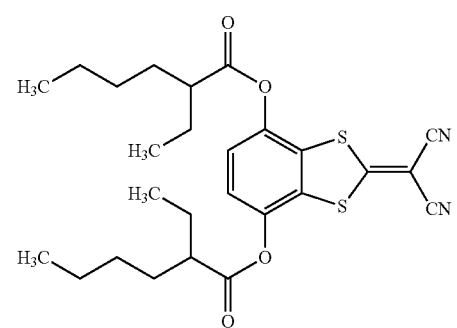
(S-18)
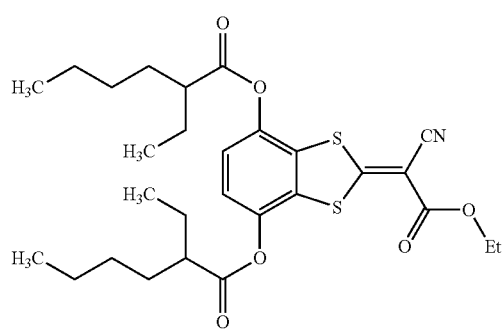
(S-19)
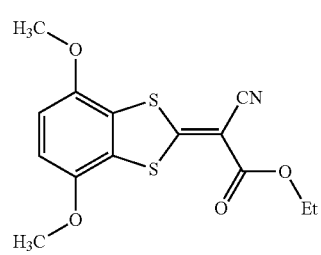
(S-20)
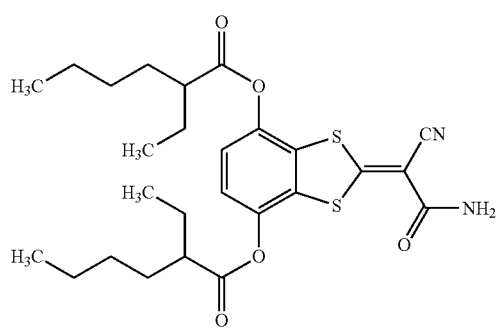
(S-21)
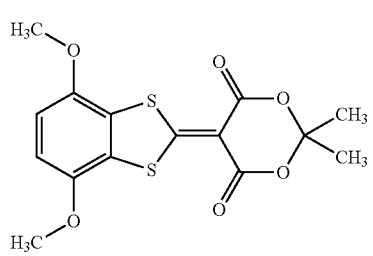
(S-22)
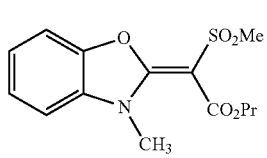
(S-23)
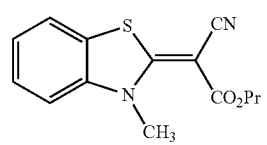
(S-24)
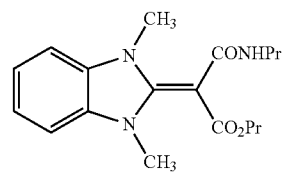
(S-25)
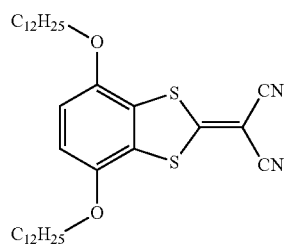
(S-26)
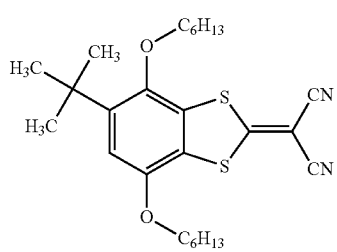

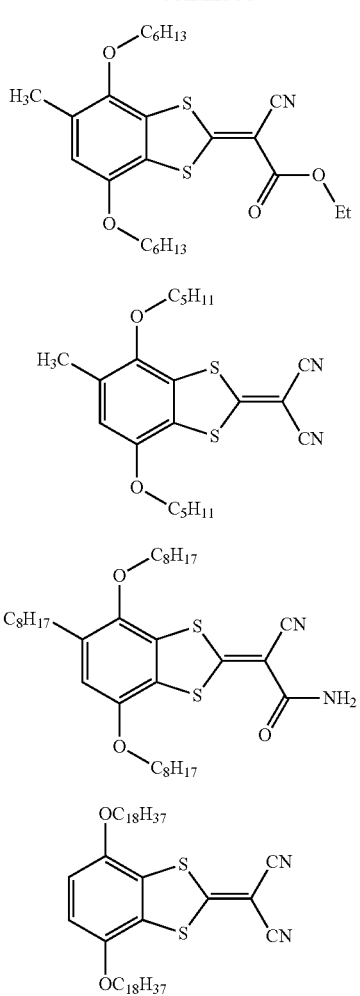

The deterioration of on-press development property (without irradiation of a mercury lamp) by adding the ultraviolet absorbing agent can also prevented by incorporating at least any ultraviolet absorbing agent selected from the compounds represented by formulae (1), (2) and (4) to (9) according to the invention into a polymer fine particle.

The ultraviolet absorbing agent containing the alkyl group described above is easily incorporated into the polymer fine particle.

The ultraviolet absorbing agent according to the invention can be easily synthesized by a person skilled in the art with reference to methods described, for example, in U.S. Pat. No. 3,422,090, JP-A-2009-96974, JP-A-2009-96973, and references cited therein.

The content of the ultraviolet absorbing agent according to the invention is preferably from 0.001 to 30% by weight, more preferably from 0.01 to 10% by weight, particularly preferably from 0.05 to 7% by weight, in the image-recording layer.

In the range of content described above, the excellent handling property under a mercury lamp which is the effect of the invention is achieved. The ultraviolet absorbing agents according to the invention may be used individually or in combination of two or more thereof (Image-Recording Layer)

The image-recording layer according to the invention contains in addition to the ultraviolet absorbing agent described above, (A) an infrared absorbing agent, (B) a radical polymerization initiator, (C) a radical polymerizable compound, (D) a polymer compound containing a polyoxyalkylene structure and is used for the preparation of a lithographic printing plate precursor capable of undergoing development after image exposure by supplying at least one of printing ink and dampening water on a printing machine.

Hereinafter, each component contained in the image-recording layer is described in order.

(A) Infrared Absorbing Agent

The infrared absorbing agent has a function of converting the infrared ray absorbed to heat and a function of being excited by the infrared ray to perform electron transfer and/or energy transfer to a radical polymerization initiator described hereinafter. The infrared absorbing agent for use in the invention is preferably a dye having an absorption maximum in a wavelength range of 760 to 1,200 nm.

As the infrared absorbing agent, compounds described in Paragraph Nos. [0058] to [0087] of JP-A-2008-195018 are used.

Of the dyes, cyanine dyes, squarylium dyes, pyrylium dyes and nickel thiolate complexes are particularly preferred. As the particularly preferable example of the dye, a cyanine dye represented by formula (a) shown below is exemplified.

Formula (a)

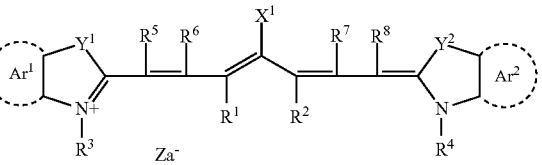

In formula (a), $X^1$ represents a hydrogen atom, a halogen atom, $—N(R^9)(R^{10})$, $X^2\text{-}L^1$ or a group shown below. $R^9$ and $R^{10}$, which may be the same or different, each represents an aromatic hydrocarbon group having from 6 to 10 carbon atoms, which may have a substituent, an alkyl group having from 1 to 8 carbon atoms, which may have a substituent or a hydrogen atom, or $R^9$ and $R^{10}$ may be combined with each other to form a ring. Among them, a phenyl group is preferable. $X^2$ represents an oxygen atom or a sulfur atom, $L^1$ represents a hydrocarbon group having from 1 to 12 carbon atoms, an aromatic ring group containing a hetero atom or a hydrocarbon group having from 1 to 12 carbon atoms and containing a hetero atom. The hetero atom used herein includes a nitrogen atom, a sulfur atom, an oxygen atom, a halogen atom and a selenium atom. In the group shown below, $Xa^-$ has the same meaning as $Za^-$ defined hereinafter, and $R^a$ represents a hydrogen atom or a substituent selected from an alkyl group, an aryl group, a substituted or unsubstituted amino group and a halogen atom.

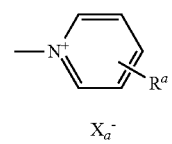

$R^1$ and $R^2$ each independently represents a hydrocarbon group having from 1 to 12 carbon atoms. In view of the preservation stability of a coating solution for image-recording layer, it is preferred that $R^1$ and $R^2$ each represents a hydrocarbon group having two or more carbon atoms. It is also preferred that $R^1$ and $R^2$ are combined with each other to form a 5-membered or 6-membered ring.

$Ar^1$ and $Ar^2$, which may be the same or different, each represents an aromatic hydrocarbon group which may have a substituent. Preferable examples of the aromatic hydrocarbon group include a benzene ring group and a naphthalene ring group. Also, preferable examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferable examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (a) has an anionic substituent in the structure thereof and neutralization of charge is not needed. In view of the preservation stability of a coating solution for image-recording layer, preferable examples of the counter ion for $Za^-$ include a halide ion, a perchlorate ion, a tetrafluoroborate ion, a hexafluorophosphate ion and a sulfonate ion, and particularly preferable examples thereof include a perchlorate ion, a hexafluorophosphate ion and an arylsulfonate ion.

Specific examples of the cyanine dye represented by formula (a), which can be preferably used in the invention, include those described in Paragraph Nos. [0017] to [0019] of JP-A-2001-133969, Paragraph Nos. [0012] to [0021] of JP-A-2002-023360 and Paragraph Nos. [0012] to [0037] of JP-A-2002-040638.

The infrared absorbing agents (A) may be used individually or in combination of two or more thereof. Also, the infrared absorbing dye may be used together with an infrared absorbing agent other than the infrared absorbing dye, for example, a pigment. As the pigment, compounds described in Paragraph Nos. [0072] to [0076] of JP-A-2008-195018 are preferably used.

The content of the infrared absorbing agent in the image-recording layer according to the invention is preferably from 0.1 to 10.0% by weight, more preferably from 0.5 to 5.0% by weight, based on the total solid content of the image-recording layer.

(B) Radical Polymerization Initiator

The radical polymerization initiator (B) for use in the invention is a compound which initiates or accelerates polymerization of a radical polymerizable compound (C). The radical polymerization initiator for use in the invention includes, for example, known thermal polymerization initiators, compounds containing a bond having small bond dissociation energy and photopolymerization initiators.

The radical polymerization initiators in the invention include, for example, (a) organic halides, (b) carbonyl compounds, (c) azo compounds, (d) organic peroxides, (e) metallocene compounds, (f) azido compounds, (g) hexaarylbiimidazole compounds, (h) organic borate compounds, (i) disulfone compounds, (j) oxime ester compounds and (k) onium salt compounds.

As the organic halides (a), compounds described in Paragraph Nos. [0022] to [0023] of JP-A-2008-195018 are preferred.

As the carbonyl compounds (b), compounds described in Paragraph No. [0024] of JP-A-2008-195018 are preferred.

As the azo compounds (c), for example, azo compounds described in JP-A-8-108621 are used.

As the organic peroxides (d), for example, compounds described in Paragraph No. [0025] of JP-A-2008-195018 are preferred.

As the metallocene compounds (e), for example, compounds described in Paragraph No. [0026] of JP-A-2008-195018 are preferred.

As the azido compounds (f), compound, for example, 2,6-bis(4-azidobenzylidene)-4-methylcyclohexanone is exemplified.

As the hexaarylbiimidazole compounds (g), for example, compounds described in Paragraph No. [0027] of JP-A-2008-195018 are preferred.

As the organic borate compounds (h), for example, compounds described in Paragraph No. [0028] of JP-A-2008-195018 are preferred.

As the disulfone compounds (i), for example, compounds described in JP-A-61-166544 and JP-A-2002-328465 are exemplified.

As the oxime ester compounds (j), for example, compounds described in Paragraph Nos. [0028] to [0030] of JP-A-2008-195018 are preferred.

As the onium salt compounds (k), onium salts, for example, diazonium salts described in S. I. Schlesinger, *Photogr. Sci. Eng.*, 18, 387 (1974) and T. S. Bal et al., *Polymer*, 21, 423 (1980), ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Patent Publication No. 2008/0311520, JP-A-2-150848, JP-A-2-296514 and JP-A-2008-195018, sulfonium salts described in European Patents 370,693, 390, 214, 233, 567, 297,443 and 297,442, U.S. Pat. Nos. 4,933,377, 4,760,013, 4,734,444 and 2,833, 827, German Patents 2,904,626, 3,604,580 and 3,604,581, selenonium salts described in J. V. Crivello et al., *Macromolecules*, 10 (6), 1307 (1977) and J. V. Crivello et al., *J. Polymer Sci., Polymer Chem. Ed.*, 17, 1047 (1979), arsonium salts described in C. S. Wen et al., *Teh, Proc. Conf. Rad. Curing ASIA*, p. 478, Tokyo, Oct. (1988), and azinium salts described in JP-A-2008-195018 are exemplified.

Of the radical polymerization initiators, the onium salts, particularly, the iodonium salts, sulfonium salts and azinium salts are preferable. Specific examples of these compounds are set forth below, but the invention should not be construed as being limited thereto.

Of the iodonium salts, diphenyliodonium salts are preferred, diphenyliodonium salts substituted with an electron donating group, for example, an alkyl group or an alkoxy group are more preferred, and asymmetric diphenyliodonium salts are still more preferred. Specific examples thereof include diphenyliodonium hexafluorophosphate, 4-methoxyphenyl-4-(2-methylpropyl)phenyliodonium hexafluorophosphate, 4-(2-methylpropyl)phenyl-p-tolyliodonium hexafluorophosphate, 4-hexyloxyphenyl-2,4,6-trimethoxyphenyliodonium hexafluorophosphate, 4-hexyloxyphenyl-2,4-diethoxyphenyliodonium tetrafluoroborate, 4-octyloxyphenyl-2,4,6-trimethoxyphenyliodonium 1-perfluorobutanesulfonate, 4-octyloxyphenyl-2,4,6-trimethoxyphenyliodonium hexafluorophosphate and bis(4-tert-butylphenyl)iodonium tetraphenylborate.

Examples of the sulfonium salt include triphenylsulfonium hexafluorophosphate, triphenylsulfonium benzoylformate, bis(4-chlorophenyl)phenylsulfonium benzoylformate, bis(4- chlorophenyl)-4-methylphenylsulfonium tetrafluoroborate and tris(4-chlorophenyl)sulfonium 3,5-bis(methoxycarbonyl)benzenesulfonate.

Examples of the azinium salt include 1-cyclohexylmethyloxypyridinium hexafluorophosphate, 1-cyclohexyloxy-4-phenylpyridinium hexafluorophosphate, 1-ethoxy-4-phenylpyridinium hexafluorophosphate, 1-(2-ethylhexyloxy)-4-phenylpyridinium hexafluorophosphate, 4-chloro-1-cyclohexylmethyloxypyridinium hexafluorophosphate, 1-ethoxy-4-cyanopyridinium hexafluorophosphate, 3,4-dichloro-1-(2-ethylhexyloxy)pyridinium hexafluorophosphate, 1-benzyloxy-4-phenylpyridinium hexafluorophosphate, 1-phenethyloxy-4-phenylpyridinium hexafluorophosphate, 1-(2-ethylhexyloxy)-4-phenylpyridinium p-toluenesulfonate, 1-(2-ethylhexyloxy)-4-phenylpyridinium perfluorobutanesulfonate, 1-(2-ethylhexyloxy)-4-phenylpyridinium bromide and 1-(2-ethylhexyloxy)-4-phenylpyridinium tetrafluoroborate.

The radical polymerization initiator can be added to the image-recording layer preferably in an amount from 0.1 to 50% by weight, more preferably from 0.5 to 30% by weight, particularly preferably from 0.8 to 20% by weight, based on the total solid content constituting the image-recording layer. In the range described above, good sensitivity and good stain resistance in the non-image area at the time of printing are obtained.

(C) Radical Polymerizable Compound

The radical polymerizable compound (C) for use in the invention is an addition-polymerizable compound having at least one ethylenically unsaturated double bond, and it is preferably selected from compounds having at least one, preferably two or more, terminal ethylenically unsaturated double bonds. Such compounds are widely known in the field of art and they can be used in the invention without any particular limitation. The compound has a chemical form, for example, a monomer, a prepolymer, specifically, a dimer, a trimer or an oligomer, or a (co)polymer thereof, or a mixture thereof.

Specific examples of the radical polymerizable compound include compounds described in Paragraph Nos. [0089] to [0098] of JP-A-2008-195018. Among them, esters of aliphatic polyhydric alcohol compound with an unsaturated carboxylic acid (for example, acrylic acid, methacrylic acid, itaconic acid, crotonic acid, isocrotonic acid or maleic acid) are preferably exemplified. Other preferable radical polymerizable compounds include polymerizable compounds containing an isocyanuric acid structure described in JP-A-2005-329708.

Among them, isocyanuric acid ethylene oxide-modified acrylates, for example, tris(acryloyloxyethyl) isocyanurate or bis(acryloyloxyethyl)hydroxyethyl isocyanurate are particularly preferred because they are excellent in balance between hydrophilicity relating to the on-press development property and polymerization ability relating to the printing durability.

In the invention, the radical polymerizable compound (C) is preferably used in an amount from 5 to 80% by weight, more preferably from 15 to 75% by weight, based on the total solid content of the image-recording layer.

(D) Polymer Compound Containing Polyoxyalkylene Structure

The image-recording layer according to the invention contains a polymer compound containing a polyoxyalkylene structure in order to be imparted the on-press development property. In particular, a polymer having a polyalkylene oxide group is preferred. The polymer having a polyalkylene oxide group, particularly a polymer compound having a polyalkylene oxide group in its side chain, may be incorporated into the image-recording layer in the form of a fine particle or as a medium (hereinafter, referred to as a binder) for compatibilizing or binding various materials of the image-recording layer without having a specific form, for example, form of a particle.

(D-1) Polymer Fine Particle

According to the invention, a polymer fine particle can be used in order to improve the on-press development property. The polymer fine particle for use in the invention is preferably at least one fine particle selected from hydrophobic thermoplastic polymer fine particle, thermo-reactive polymer fine particle, microcapsule having a hydrophobic compound encapsulated therein and crosslinked polymer fine particle (microgel).

According to the invention, it is preferred in view of improvement in the on-press development property that the polymer fine particle has a polyalkylene oxide structure. In particular, a polyethylene oxide group is preferred where the alkylene oxide group is an ethylene oxide group and a number of repeating unit of the ethylene oxide group is from 12 to 250.

In the case of the hydrophobic thermoplastic polymer fine particle or thermo-reactive polymer fine particle, the introduction of the polyalkylene oxide structure into the polymer fine particle is conducted, for example, according to a method of effecting emulsion polymerization or suspension polymerization of a monomer having a polyalkylene oxide structure corresponding to a repeating unit represented by formula (T-1) or (T-2) shown below, for example, an acrylate or methacrylate having a polyalkylene oxide structure. In such a case, as a copolymerizable monomer, ethylene, styrene, vinyl chloride, methyl acrylate, ethyl acrylate, methyl methacrylate, ethyl methacrylate, vinylidene chloride, acrylonitrile and vinyl carbazole are exemplified. Among them, styrene, acrylonitrile and methyl methacrylate are more preferably exemplified.

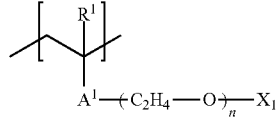

(T-1)

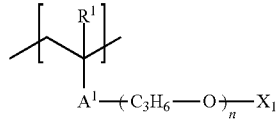

(T-2)

In formulae (T-1) and (T-2), $R^1$ represents a hydrogen atom or a methyl group, $A^1$ represents a divalent connecting group of OCOO— or —CONH—, $X_1$ represents a hydrocarbon group having 3 or less carbon atoms or a hydrogen atom, and n represents an integer of 2 or more.

The hydrophobic thermoplastic polymer fine particle means fine particle which is fused by heat generated at the time of infrared laser exposure to hydrophobilize as described, for example, in *Research Disclosure*, No. 33303, January (1992), JP-A-9-123387, JP-A-9-131850, JP-A-9-171249, JP-A-9-171250 and European Patent 931,647.

The thermo-reactive polymer fine particle means a polymer fine particle forming a hydrophobilized region by crosslinkage due to thermal reaction and change in the functional group involved therein and includes a polymer fine particle having a thermo-reactive group.

As the thermo-reactive group of the polymer fine particle having a thermo-reactive group for use in the invention, a functional group performing any reaction can be used as long as a chemical bond is formed. For instance, an ethylenically unsaturated group (for example, an acryloyl group, a methacryloyl group, a vinyl group or an allyl group) performing a radical polymerization reaction, a cationic polymerizable group (for example, a vinyl group or a vinyloxy group), an isocyanate group performing an addition reaction or a blocked form thereof, an epoxy group, a vinyloxy group and a functional group having an active hydrogen atom (for example, an amino group, a hydroxy group or a carboxyl group) as the reaction partner thereof, a carboxyl group performing a condensation reaction and a hydroxyl group or an amino group as the reaction partner thereof, and an acid anhydride performing a ring opening addition reaction and an amino group or a hydroxyl group as the reaction partner thereof are preferably exemplified.

In the case of the microcapsule or microgel, the introduction of the polyalkylene oxide structure into the polymer fine particle is conducted according to a known method, for example, a method of adding, for example, polyalkylene oxide monoalkyl ether to the components of interfacial polymerization using a polyfunctional isocyanate by applying the descriptions of the polymer fine particle below.

As the microcapsule for use in the invention, microcapsule having all or part of the constituting components of the image-recording layer encapsulated therein as described, for example, in JP-A-2001-277740 and JP-A-2001-277742 is exemplified. The constituting components of the image-recording layer may be present outside the microcapsules. It is a more preferable embodiment of the image-recording layer containing microcapsules that hydrophobic constituting components are encapsulated in the microcapsules and hydrophilic components are present outside the microcapsules.

The image-recording layer according to the invention may be an embodiment containing a crosslinked resin particle, that is, a microgel. The microgel can contain a part of the constituting components of the image-recording layer inside and/or on the surface thereof. Particularly, an embodiment of a reactive microgel containing the radical polymerizable compound (C) on the surface thereof is preferred in view of the image-forming sensitivity and printing durability.

As a method of microencapsulation or microgelation of the constituting components of the image-recording layer, known methods can be used.

According to the invention, in particular, by incorporating the ultraviolet absorbing agent into the polymer fine particle to be included in the image-recording layer, the handling property under a mercury lamp is improved and the good on-press development property can be achieved. An embodiment of including the ultraviolet absorbing agent containing an alkyl group having from 8 to 20 carbon atoms in the polymer fine particles is particularly preferred. The ultraviolet absorbing agent containing an alkyl group having from 8 to 20 carbon atoms is easily incorporated into the polymer fine particle at the synthesis of the polymer fine particle and preferred in view of the synthesis.

The content of the ultraviolet absorbing agent in the polymer fine particle is preferably from 0.001 to 60% by weight, more preferably from 0.01 to 50% by weight, and particularly preferably from 0.05 to 30% by weight.

The average particle size of the polymer fine particle is preferably from 0.01 to 3.0 µm, more preferably from 0.05 to 2.0 µm, particularly preferably from 0.10 to 1.0 µm. In the range described above, good resolution and good time-lapse stability can be achieved.

The content of the polymer fine particle is preferably in a range of 5 to 90% by weight based on the total solid content of the image-recording layer.

(D-2) Binder Polymer

In the image-recording layer according to the invention, a binder polymer can be used as a binder for each component of the image-recording layer and for the purpose of improving film strength of the image-recording layer. The binder polymer which can be used in the invention can be selected from those heretofore known without restriction, and polymers having a film-forming property are preferred. Among them, acrylic resins, polyvinyl acetal resins and polyurethane resins are preferred.

It is particularly preferred that the binder polymer has a alkylene oxide structure as a hydrophilic group from the standpoint of improving the on-press development property. A polyethyleneoxy group is preferred where the alkylene oxide group is an ethylene oxide group and a number of repeating unit of the ethylene oxide group is from 2 to 8. An acrylic resin obtained by copolymerization of a monomer having a polyalkylene oxide structure corresponding to the repeating unit represented by formula (T-1) or (T-2) shown above is particularly preferred.

In order to control the ink-receptive property, an oleophilic group, for example, an alkyl group, an aryl group, an aralkyl group or an alkenyl group may be introduced into the binder polymer according to the invention. Specifically, an oleophilic group-containing monomer, for example, an alkyl methacrylate may be copolymerized.

As the binder polymer preferable for the invention, a polymer having a crosslinkable functional group for increasing film strength of the image area in its main chain or side chain, preferably in its side chain, as described in JP-A-2008-195018 is exemplified. Due to the crosslinkable functional group, crosslinkage is formed between the polymer molecules to facilitate curing.

As the crosslinkable functional group, an ethylenically unsaturated group, for example, a (meth)acryl group, a vinyl group or an allyl group or an epoxy group is preferred. The crosslinkable functional group can be introduced into the polymer by a polymer reaction or copolymerization. For instance, a reaction between an acrylic polymer or polyurethane having a carboxyl group in its side chain and glycidyl methacrylate or a reaction between a polymer having an epoxy group and a carboxylic acid containing an ethylenically unsaturated group, for example, methacrylic acid can be utilized.

The content of the crosslinkable group in the binder polymer is preferably from 0.1 to 10.0 mmol, more preferably from 1.0 to 7.0 mmol, most preferably from 2.0 to 5.5 mmol, based on 1 g of the binder polymer.

Moreover, the binder polymer may further contain a hydrophilic group other than the polyalkylene oxide structure. The other hydrophilic group includes, for example, a hydroxy group, a carboxyl group, an amino group, an ammonium group, an amido group, a sulfo group and a phosphoric acid group. The hydrophilic group contributes to impart the on-press development property to the image-recording layer. In particular, coexistence of the crosslinkable group and the hydrophilic group makes it possible to maintain good balance between the printing durability and developing property.

In order to introduce the hydrophilic group into the binder polymer, a monomer having the hydrophilic group may be copolymerized.

Specific examples (1) to (11) of the binder polymer for use in the invention are set forth below, but the invention should not be construed as being limited thereto.
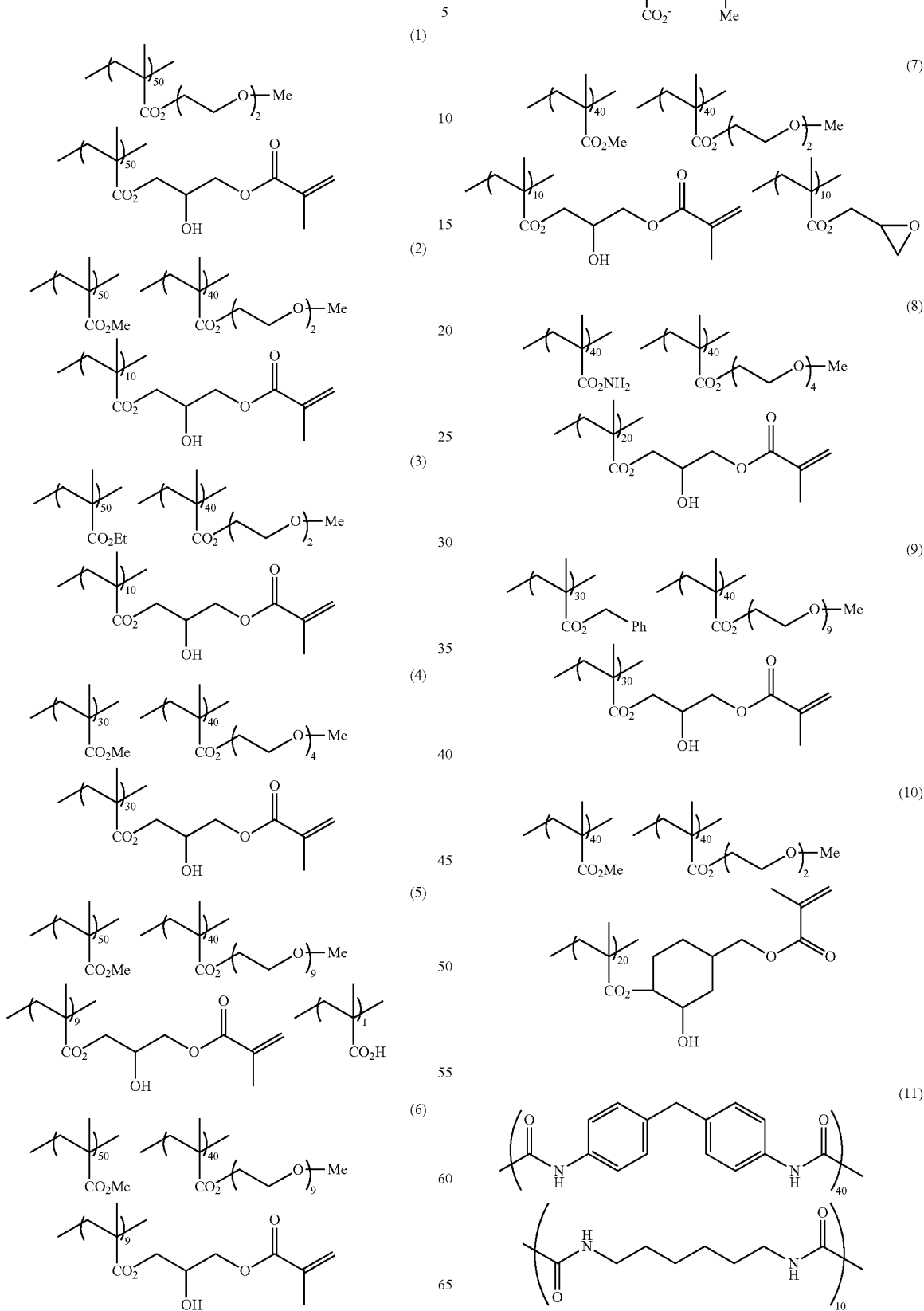

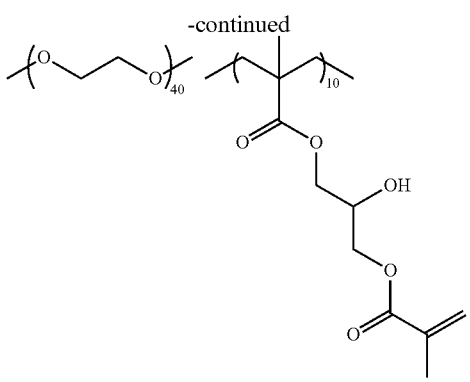

The weight average molecular weight (Mw) of the binder polymer according to the invention is preferably 2,000 or more, more preferably 5,000 or more, and still more preferably from 10,000 to 300,000.

According to the invention, a hydrophilic polymer, for example, polyacrylic acid or polyvinyl alcohol described in JP-A-2008-195018 may be used, if desired. Further, an oleophilic binder polymer is used together with a hydrophilic binder polymer.

The content of the binder polymer is preferably ordinarily from 5 to 90% by weight, preferably from 5 to 80% by weight, more preferably from 10 to 70% by weight, based on the total solid content of the image-recording layer.

(F) Hydrophilic Low Molecular Weight Compound

The image-recording layer according to the invention may contain a hydrophilic low molecular weight compound in order to improve the on-press development property without accompanying the deterioration of the printing durability.

The hydrophilic low molecular weight compound includes a water-soluble organic compound, for example, a glycol compound, e.g., ethylene glycol, diethylene glycol, triethylene glycol, propylene glycol, dipropylene glycol or tripropylene glycol, or an ether or ester derivative thereof, a polyhydroxy compound, e.g., glycerine, pentaerythritol or tris(2-hydroxyethyl) isocyanurate, an organic amine compound, e.g., triethanolamine, diethanolamine or monoethanolamine, or a salt thereof, an organic sulfonic acid compound, e.g., an alkyl sulfonic acid, toluene sulfonic acid or benzene sulfonic acid, or a salt thereof, an organic sulfamic acid compound, e.g., an alkyl sulfamic acid, or a salt thereof, an organic sulfuric acid compound, e.g., an alkyl sulfuric acid or an alkyl ether sulfuric acid, or a salt thereof, an organic phosphonic acid compound, e.g., phenyl phosphonic acid, or a salt thereof, an organic carboxylic acid, e.g., tartaric acid, oxalic acid, citric acid, malic acid, lactic acid, gluconic acid or an amino acid, or a salt thereof and a betaine compound.

According to the invention, it is preferred that at least one compound selected from a polyol compound, an organic sulfate compound, an organic sulfonate compound and a betaine compound is incorporated.

Specific examples of the organic sulfonate compound include an alkylsulfonate, for example, sodium n-butylsulfonate, sodium n-hexylsulfonate, sodium 2-ethylhexylsulfonate, sodium cyclohexylsulfonate or sodium n-octylsulfonate, an alkylsulfonate containing an ethylene oxide chain, for example, sodium 5,8,11-trioxapentadecane-1-sulfonate, sodium 5,8,11-trioxaheptadecane-1-sulfonate, sodium 13-ethyl-5,8,11-trioxaheptadecane-1-sulfonate or sodium 5,8,11,14-tetraoxatetracosane-1-sulfonate, an arylsulfonate, for example, sodium benzenesulfonate, sodium p-toluenesulfonate, sodium p-hydroxybenzenesulfonate, sodium p-styrenesulfonate, sodium isophthalic acid dimethyl-5-sulfonate, sodium 1-naphtylsulfonate, sodium 4-hydroxynaphtylsulfonate, disodium 1,5-naphthalenedisulfonate or trisodium 1,3,6-naphthalenetrisulfonate, and an alkyl polyoxyalkylene sulfoalkyl ether salt, for example, n-octyl (diethyleneoxy)sulfobutyl ether sodium salt, 2-ethylhexyl (diethyleneoxy)sulfobutyl ether sodium salt, n-decyl(diethyleneoxy)sulfobutyl ether sodium salt, n-dodecyl (diethyleneoxy)sulfobutyl ether sodium salt, n-octyl (diethyleneoxy)sulfobutyl ether potassium salt, 2-ethylhexyl (diethyleneoxy)sulfobutyl ether potassium salt, n-decyl (diethyleneoxy)sulfobutyl ether potassium salt, n-dodecyl (diethyleneoxy)sulfobutyl ether potassium salt, n-octyl (diethyleneoxy)sulfopropyl ether sodium salt, 2-ethylhexyl (diethyleneoxy)sulfopropyl ether sodium salt, n-decyl (diethyleneoxy)sulfopropyl ether sodium salt, n-dodecyl (diethyleneoxy)sulfopropyl ether sodium salt, 2-ethylhexyl (diethyleneoxy)sulfobutyl ether ammonium salt, 2-ethylhexyl(diethyleneoxy)sulfobutyl ether triethylammonium salt or 2-ethylhexyl(diethyleneoxy)sulfobutyl ether pyridinium salt.

The organic sulfate compound includes a sulfate of alkyl, alkenyl, alkynyl, aryl or heterocyclic monoether of polyethylene oxide. The number of ethylene oxide units is preferably from 1 to 4. The salt is preferably a sodium salt, a potassium salt or a lithium salt.

As the betaine compound, a compound wherein a number of carbon atoms included in a hydrocarbon substituent on the nitrogen atom is from 1 to 5 is preferred. Specific examples thereof include trimethylammonium acetate, dimethylpropylammonium acetate, 3-hydroxy-4-trimethylammoniobutyrate, 4-(1-pyridinio)butyrate, 1-hydroxyethyl-1-imidazolioacetate, trimethylammonium methanesulfonate, dimethylpropylammonium methanesulfonate, 3-trimethylammonio-1-porpanesulfonate and 3-(1-pyridinio)-1-porpanesulfonate.

The hydrophilic low molecular weight compound acts for increasing penetration of dampening water into the unexposed area (non-image area) of the image-recording layer and does not deteriorate the hydrophobicity and film strength of the image area and thus, the ink receptive-property and printing durability of the image-recording layer can be preferably maintained.

The amount of the hydrophilic low molecular weight compound added to the image-recording layer is preferably from 0.5 to 20% by weight, more preferably from 1 to 10% by weight, still more preferably from 2 to 10% by weight, based on the total solid content of the image-recording layer. In the range described above, good on-press development property and good printing durability are achieved.

The hydrophilic low molecular weight compounds may be used individually or as a mixture of two or more thereof.

(G) Oil-Sensitizing Agent

In order to improve the ink-receptive property, an oil-sensitizing agent, for example, a phosphonium compound, a nitrogen-containing low molecular weight compound or an ammonium group-containing polymer can be used in the image-recording layer. In particular, in the case where an inorganic stratiform compound is incorporated into an oxygen-blocking layer described hereinafter, the oil-sensitizing agent functions as a surface covering agent of the inorganic stratiform compound and prevents deterioration of the ink-receptive property during printing due to the inorganic stratiform compound.

As preferable examples of the phosphonium compound, phosphonium compounds described in JP-A-2006-297907 and JP-A-2007-50660 are exemplified. Specific examples of the phosphonium compound include tetrabutylphosphonium iodide, butyltriphenylphosphonium bromide, tetraphenylphosphonium bromide, 1,4-bis(triphenylphosphonio)butane di(hexafluorophosphate), 1,7-bis(triphenylphosphonio) heptane sulfate and 1,9-bis(triphenylphosphonio)nonane naphthalene-2,7-disulfonate.

As the nitrogen-containing low molecular weight compound, an amine salt and a quaternary ammonium salt are exemplified. Also, an imidazolinium salt, a benzimidazolinium salt, a pyridinium salt and a quinolinium salt are exemplified. Of the nitrogen-containing low molecular weight compounds, the quaternary ammonium salt and pyridinium salt are preferably used. Specific examples the nitrogen-containing low molecular weight compound include tetramethylammonium hexafluorophosphate, tetrabutylammonium hexafluorophosphate, dodecyltrimethylammonium p-toluenesulfonate, benzyltriethylammonium hexafluorophosphate, benzyldimethyloctyl ammonium hexafluorophosphate and benzyldimethyldodecylammonium hexafluorophosphate.

The ammonium group-containing polymer may be any polymer containing an ammonium group in its structure and is preferably a polymer containing from 5 to 80% by mole of (meth)acrylate having an ammonium group in its side chain as a copolymerization component.

As to the ammonium group-containing polymer, its reduced specific viscosity value (unit: cSt/g/ml) determined according to the measurement method described below is preferably from 5 to 120, more preferably from 10 to 110, and particularly preferably from 15 to 100.

<Measurement Method of Reduced Specific Viscosity>

In a 20 ml measuring flask was weighed 3.33 g of a 30% polymer solution (1 g as a solid content) and the measuring flask was filled up to the gauge line with N-methyl pyrrolidone. The resulting solution was put into an Ubbelohde viscometer (viscometer constant: 0.010 cSt/s) and a period for running down of the solution at 30° C. was measured. The viscosity was determined in a conventional manner according to the following calculation formula:

Kinetic viscosity=Viscometer constant×Period for liquid to pass through a capillary (sec)

Specific examples of the ammonium group-containing polymer are set forth below.

(1) 2-(Trimethylammonio)ethyl methacrylate p-toluenesulfonate/3,6-dioxaheptyl methacrylate copolymer (molar ratio: 10/90)
(2) 2-(Trimethylammonio)ethyl methacrylate hexafluorophosphate/3,6-dioxaheptyl methacrylate copolymer (molar ratio: 20/80)
(3) 2-(Ethyldimethylammonio)ethyl methacrylate p-toluenesulfonate/hexyl methacrylate copolymer (molar ratio: 30/70)
(4) 2-(Trimethylammonio)ethyl methacrylate hexafluorophosphate/2-ethylhexyl methacrylate copolymer (molar ratio: 20/80)
(5) 2-(Trimethylammonio)ethyl methacrylate methylsulfate/hexyl methacrylate copolymer (molar ratio: 40/60)
(6) 2-(Butyldimethylammonio)ethyl methacrylate hexafluorophosphate/3,6-dioxaheptyl methacrylate copolymer (molar ratio: 20/80)
(7) 2-(Butyldimethylammonio)ethyl acrylate hexafluorophosphate/3,6-dioxaheptyl methacrylate copolymer (molar ratio: 20/80)
(8) 2-(Butyldimethylammonio)ethyl methacrylate 13-ethyl-5,8,11-trioxa-1-heptadecanesulfonate/3,6-dioxaheptyl methacrylate copolymer (molar ratio: 20/80)
(9) 2-(Butyldimethylammonio)ethyl methacrylate hexafluorophosphate/3,6-dioxaheptyl methacrylate/2-hydroxy-3-methacryloyloxypropyl methacrylate copolymer (molar ratio: 15/80/5)

The content of the oil-sensitizing agent is preferably from 0.01 to 30.0% by weight, more preferably from 0.1 to 15.0% by weight, still more preferably from 1 to 10% by weight, based on the total solid content of the image-recording layer.

(H) Other Components

Other components, for example, a surfactant, a coloring agent, a print-out agent, a polymerization inhibitor, a higher fatty acid derivative, a plasticizer, a fine inorganic particle, an inorganic stratiform compound, a co-sensitizer or a chain transfer agent may further be added to the image-recording layer. Specifically, compounds and amounts added thereof described, for example, in Paragraph Nos. [0114] to [0159] of JP-A-2008-284817, Paragraph Nos. [0023] to [0027] of JP-A-2006-91479 and Paragraph No. [0060] of U.S. Patent Publication No. 2008/0311520 are preferably used.

(I) Formation of Image-Recording Layer

The image-recording layer according to the invention is formed by dispersing or dissolving each of the necessary constituting components described above in a known solvent to prepare a coating solution and coating the solution on a support by a known method, for example, bar coater coating and drying as described, for example, in Paragraph Nos. [0142] to [0143] of JP-A-2008-195018. The coating amount (solid content) of the image-recording layer formed on the support after coating and drying may be varied according to the intended purpose but is in general preferably from 0.3 to 3.0 g/m$^2$. In the range described above, good sensitivity and good film property of the image-recording layer can be achieved.

(Undercoat Layer)

In the lithographic printing plate precursor according to the invention, an undercoat layer (also referred to as an intermediate layer sometimes) is preferably provided between the image-recording layer and the support. The undercoat layer strengthens adhesion between the support and the image-recording layer in the exposed area and makes removal of the image-recording layer from the support in the unexposed area easy, thereby contributing improvement in the developing property without accompanying degradation of the printing durability. Further, it is advantageous that in the case of infrared laser exposure, since the undercoat layer acts as a heat insulating layer, decrease in sensitivity due to diffusion of heat generated upon the exposure into the support is prevented.

As a compound for use in the undercoat layer, specifically, for example, a silane coupling agent having an addition-polymerizable ethylenic double bond reactive group described in JP-A-10-282679 and a phosphorus compound having an ethylenic double bond reactive group described in JP-A-2-304441 are exemplified. A polymer resin having an adsorbing group capable of adsorbing to a surface of the support, a hydrophilic group and a crosslinkable group as described in JP-A-2005-125749 and JP-A-2006-188038 is more preferably exemplified. The polymer resin is preferably a copolymer of a monomer having the adsorbing group, a monomer having the hydrophilic group and a monomer having the crosslinkable group. More specifically, a polymer resin which is a copolymer of a monomer having an adsorbing group, for example, a phenolic hydroxy group, a carboxyl group, —PO$_3$H$_2$, —OPO$_3$H$_2$, —CONHSO$_2$—, —SO$_2$NHSO$_2$— or —COCH$_2$COCH$_3$, a monomer having a hydrophilic sulfo group and a monomer having a polymerizable crosslinkable group, for example, a methacryl group or an allyl group is preferred. The polymer resin may contain a crosslinkable group introduced by a salt formation between a polar substituent of the polymer resin and a compound containing a substituent having a counter charge to the polar substituent of the polymer resin and an ethylenically unsaturated bond and also may be further copolymerized with a monomer other than those described above, preferably a hydrophilic monomer.

The content of the unsaturated double bond in the polymer resin for undercoat layer is preferably from 0.1 to 10.0 mmol, most preferably from 2.0 to 5.5 mmol, based on 1 g of the polymer resin.

The weight average molecular weight of the polymer resin for undercoat layer is preferably 5,000 or more, more preferably from 10,000 to 300,000.

The undercoat layer according to the invention may contain a chelating agent, a secondary or tertiary amine, a polymerization inhibitor or a compound containing an amino group or a functional group having polymerization inhibition ability and a group capable of interacting with the surface of aluminum support (for example, 1,4-diazobicyclo [2,2,2] octane (DABCo), 2,3,5,6-tetrahydroxy-p-quinone, chloranil, sulfophthalic acid, hydroxyethylethylenediaminetriacetic acid, dihydroxyethylethylenediaminediacetic acid or hydroxyethyliminodiacetic acid) in addition to the compounds for the undercoat layer described above in order to prevent the occurrence of stain due to preservation of the lithographic printing plate precursor.

The undercoat layer is coated according to a known method. The coating amount (solid content) of the undercoat layer is preferably from 0.1 to 100 mg/m$^2$, and more preferably from 1 to 30 mg/m$^2$.

(Support)

As the support for use in the lithographic printing plate precursor according to the invention, a known support can be used. Particularly, an aluminum plate subjected to roughening treatment and anodizing treatment according to a known method is preferred.

Also, other treatments, for example, an enlarging treatment or sealing treatment of micropores of the anodized film described in JP-A-2001-253181 and JP-A-2001-322365 or a surface hydrophilizing treatment, for example, with an alkali metal silicate as described in U.S. Pat. Nos. 2,714,066, 3,181, 461, 3,280,734 and 3,902,734 or polyvinyl phosphonic acid as described in U.S. Pat. Nos. 3,276,868, 4,153,461 and 4,689,272 may be appropriately selected and applied to the aluminum plate, if desired.

The support preferably has a center line average roughness of 0.10 to 1.2 μm.

The support may have a backcoat layer containing an organic polymer compound described in JP-A-5-45885 or an alkoxy compound of silicon described in JP-A-5-45885, provided on the back surface thereof, if desired.

(Oxygen-Blocking Layer)

As for the lithographic printing plate precursor according to the invention, it is preferred to provide an oxygen-blocking layer (overcoat layer) on the image-recording layer. The oxygen-blocking layer has a function for preventing, for example, occurrence of scratch in the image-recording layer or ablation caused by exposure with a high illuminance laser beam, in addition to the function of blocking oxygen to prevent an inhibitory reaction against the image formation.

With respect to the oxygen-blocking layer having such properties, there are described, for example, in U.S. Pat. No. 3,458,311 and JP-B-55-49729 (the term "JP-B" as used herein means an "examined Japanese patent publication"). As a polymer having low oxygen permeability for use in the oxygen-blocking layer, any water-soluble polymer and water-insoluble polymer can be appropriately selected to use. Specifically, for example, polyvinyl alcohol, a modified polyvinyl alcohol, polyvinyl pyrrolidone, a water-soluble cellulose derivative and poly(meth)acrylonitrile are exemplified.

It is also preferred that the oxygen-blocking layer contains an inorganic stratiform compound, for example, natural mica or synthetic mica as described in JP-A-2005-119273 in order to increase the oxygen blocking property.

Further, the oxygen-blocking layer may contain a known additive, for example, a plasticizer for imparting flexibility, a surfactant for improving a coating property or a fine inorganic particle for controlling a surface slipping property. The oil-sensitizing agent described with respect to the image-recording layer may also be incorporated into the oxygen-blocking layer.

The oxygen-blocking layer is coated according to a known method. The coating amount of the oxygen-blocking layer is preferably in a range of 0.01 to 10 g/m$^2$, more preferably in a range of 0.02 to 3 g/m$^2$, most preferably in a range of 0.02 to 1 g/m$^2$, in terms of the coating amount after drying.

[Plate Making Method]

Plate making of the lithographic printing plate precursor according to the invention is preferably performed by an on-press development method. The on-press development method includes a step in which the lithographic printing plate precursor is imagewise exposed and a printing step in which oily ink and an aqueous component are supplied to the exposed lithographic printing plate precursor without undergoing any development processing to perform printing, and it is characterized in that the unexposed area of the image-recording layer of the lithographic printing plate precursor are removed in the course of the printing step. The imagewise exposure may be performed on a printing machine after the lithographic printing plate precursor is mounted on the printing machine or may be separately performed using a plate-setter or the like. In the latter case, the exposed lithographic printing plate precursor is mounted as it is on a printing machine without undergoing a development processing step. Then, the printing operation is initiated using the printing machine with supplying oily ink and an aqueous component and at an early stage of the printing the on-press development processing is carried out. Specifically, the image-recording layer in the unexposed area is removed and the hydrophilic surface of support is revealed therewith to form the non-image area. As the oily ink and aqueous component, printing ink and dampening water for conventional lithographic printing can be employed, respectively.

The on-press development method is described in more detail below.

The light source used for the image exposure in the invention is preferably a laser. The laser for use in the invention is not particularly restricted and preferably includes, for example, a solid laser or semiconductor laser emitting an infrared ray having a wavelength of 760 to 1,200 nm.

With respect to the infrared ray laser, the output is preferably 100 mW or more, the exposure time per pixel is preferably within 20 microseconds, and the irradiation energy is preferably from 10 to 300 mJ/cm$^2$. With respect to the laser exposure, in order to shorten the exposure time, it is preferred to use a multibeam laser device.

The exposed lithographic printing plate precursor is mounted on a plate cylinder of a printing machine. In case of using a printing machine equipped with a laser exposure apparatus, the lithographic printing plate precursor is mounted on a plate cylinder of the printing machine and then subjected to the imagewise exposure.

When dampening water and printing ink are supplied to the imagewise exposed lithographic printing plate precursor to perform printing, in the exposed area of the image-recording layer, the image-recording layer cured by the exposure forms the printing ink receptive area having the oleophilic surface. On the other hand, in the unexposed area, the uncured image-recording layer is removed by dissolution or dispersion with the dampening water and/or printing ink supplied to reveal the hydrophilic surface in the area. As a result, the dampening water adheres on the revealed hydrophilic surface and the printing ink adheres to the exposed area of the image-recording layer, whereby printing is initiated.

While either the dampening water or printing ink may be supplied at first on the surface of lithographic printing plate precursor, it is preferred to supply the printing ink at first in view of preventing the dampening water from contamination with the component of the image-recording layer removed.

Thus, the lithographic printing plate precursor according to the invention is subjected to the on-press development on an offset printing machine and used as it is for printing a large number of sheets.

EXAMPLE

The present invention will be described in more detail with reference to the following examples, but the invention should not be construed as being limited thereto.

Examples 1 to 48 and Comparative Examples 1 to 2

1. Preparation of Lithographic Printing Plate Precursors (1) to (24) According to the Invention (1) Preparation of Support An aluminum plate (material: JIS A 1050) having a thickness of 0.3 mm was subjected to a degreasing treatment at 50° C. for 30 seconds using a 10% by weight aqueous sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 g/cm$^3$) of pumice having a median size of 25 μm, followed by thorough washing with water. The plate was subjected to etching by immersing in a 25% by weight aqueous sodium hydroxide solution of 45° C. for 9 seconds, washed with water, then immersed in a 20% by weight aqueous nitric acid solution at 60° C. for 20 seconds, and washed with water. The etching amount of the grained surface was about 3 g/m$^2$.

Then, using an alternating current of 60 Hz, an electrochemical roughening treatment was continuously carried out on the plate. The electrolytic solution used was a 1% by weight aqueous nitric acid solution (containing 0.5% by weight of aluminum ion) and the temperature of electrolytic solution was 50° C. The electrochemical roughening treatment was conducted using an alternating current source, which provides a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary anode. The current density was 30 A/dm$^2$ in terms of the peak value of the electric current, and 5% of the electric current flowing from the electric source was divided to the auxiliary anode. The quantity of electricity in the nitric acid electrolysis was 175 C/dm$^2$ in terms of the quantity of electricity when the aluminum plate functioned as an anode. The plate was then washed with water by spraying.

The plate was further subjected to an electrochemical roughening treatment in the same manner as in the nitric acid electrolysis above using as an electrolytic solution, a 0.5% by weight aqueous hydrochloric acid solution (containing 0.5% by weight of aluminum ion) having temperature of 50° C. and under the condition that the quantity of electricity was 50 C/dm$^2$ in terms of the quantity of electricity when the aluminum plate functioned as an anode. The plate was then washed with water by spraying.

The plate was then subjected to an anodizing treatment using as an electrolytic solution, a 15% by weight aqueous sulfuric acid solution (containing 0.5% by weight of aluminum ion) at a current density of 15 A/dm$^2$ to form a direct current anodized film of 2.5 g/m$^2$, washed with water and dried to prepare Support (1).

Thereafter, in order to ensure the hydrophilicity of the non-image area, Support (1) was subjected to silicate treatment using a 2.5% by weight aqueous sodium silicate No. 3 solution at 60° C. for 10 seconds and then washed with water to obtain Support (2). The adhesion amount of Si was 10 mg/m$^2$. The center line average roughness (RA) of the support was measured using a stylus having a diameter of 2 μm and found to be 0.51 μm.

(2) Formation of Undercoat Layer

Coating solution (1) for undercoat layer shown below was coated on Support (2) so as to have a dry coating amount of 20 mg/m$^2$ to prepare a support having an undercoat layer for using the experiments described below.

| <Coating solution (1) for undercoat layer> | |
|---|---|
| Compound (1) for undercoat layer having structure shown below | 0.18 g |
| Hydroxyethyliminodiacetic acid | 0.10 g |
| Methanol | 55.24 g |
| Water | 6.15 g |

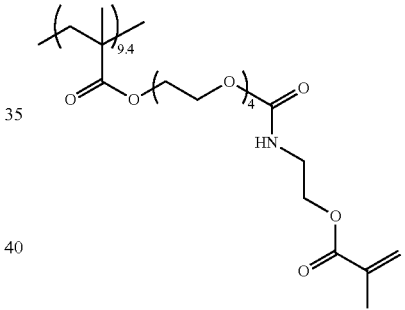

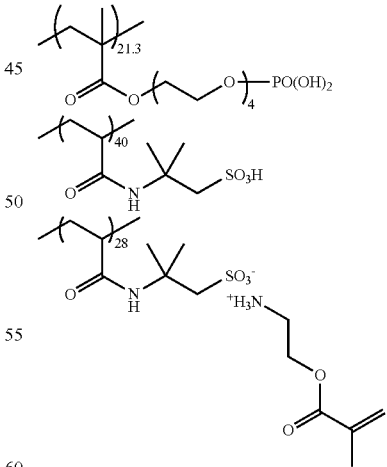

(Mw: 100,000)
Compound (1) for undercoat layer (3) Formation of Image-Recording Layer Coating solution (1) for image-recording layer having the composition shown below was coated on the undercoat layer described above by a bar and dried in an oven at 100° C. for 60 seconds to form an image-recording layer having a dry coating amount of 1.0 g/m².

Coating solution (1) for image-recording layer was prepared by mixing Photosensitive solution (1) shown below with Microgel solution (1) shown below just before the coating, followed by stirring.

| <Photosensitive solution (1)> | |
| --- | --- |
| Ultraviolet absorbing agent shown in Table 1-1 | 0.030 g |
| Binder polymer (1) having structure shown below | 0.240 g |
| Infrared absorbing agent (1) having structure shown below | 0.030 g |
| Radical polymerization initiator (1) having structure shown below | 0.162 g |
| Radical polymerizable compound (Tris(acryloyloxyethyl) isocyanurate (NK ESTER A-9300, produced by Shin-Nakamura Chemical Co., Ltd.)) | 0.192 g |
| Hydrophilic low molecular weight compound (Tris(2-hydroxyethyl) isocyanurate) | 0.062 g |
| Hydrophilic low molecular weight compound (1) having structure shown below | 0.050 g |
| Oil-sensitizing agent (Phosphonium compound (1) having structure shown below) | 0.055 g |
| Oil-sensitizing agent (Benzyl dimethyl octyl ammonium PF$_6$ salt | 0.018 g |
| Oil-sensitizing agent (Ammonium group-containing polymer having structure shown below (reduced specific viscosity: 44 cSt/g/ml) | 0.030 g |
| Fluorine-based surfactant (1) having structure shown below | 0.008 g |
| 2-Butanone | 1.091 g |
| 1-Methoxy-2-propanol | 8.609 g |

| <Microgel solution (1)> | |
| --- | --- |
| Microgel (1) shown below | 2.640 g |
| Distilled water | 2.425 g |

The structures of Binder polymer (1), Infrared absorbing agent (1), Radical polymerization initiator (1), Phosphonium compound (1), Hydrophilic low molecular weight compound (1), Oil-sensitizing agent (ammonium group-containing polymer) and Fluorine-based surfactant (1) are shown below.

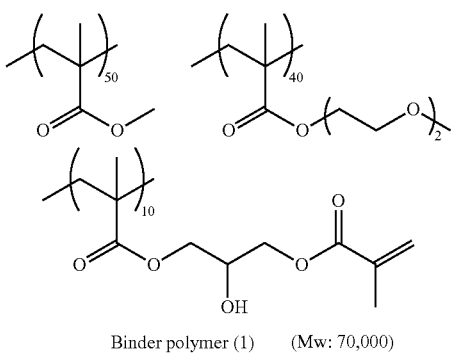

Binder polymer (1)   (Mw: 70,000)

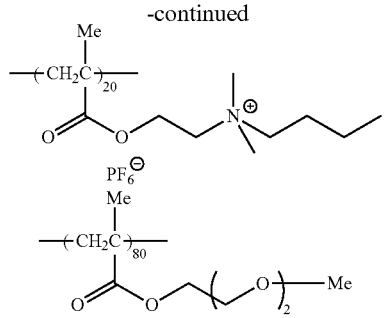

Ammonium Group-Containing Polymer

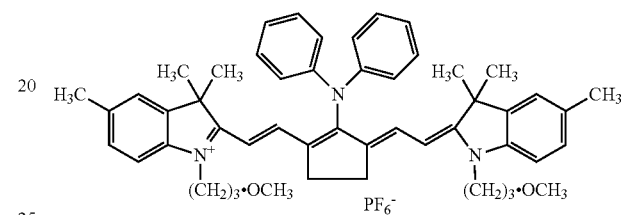

Infrared absorbing agent (1)

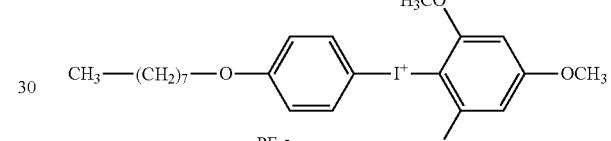

Radical polymerization initiator (1)

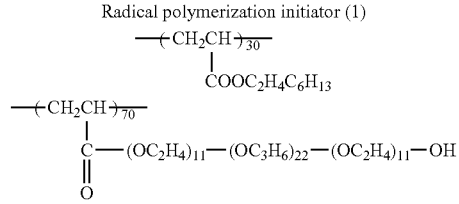

Fluorine-based surfactant (1)

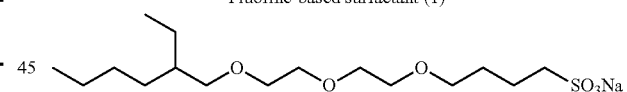

Hydrophilic low molecular weight compound (1)

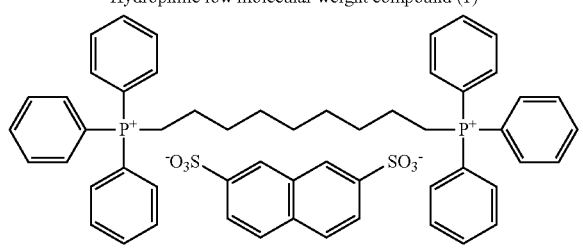

Phosphonium compound (1)

(Preparation of Microgel (1))

An oil phase component was prepared by dissolving 4.46 g of polyfunctional isocyanate having the structure shown below (produced by Mitsui Chemicals Polyurethanes, Inc., 75% ethyl acetate solution), 0.86 g of adduct obtained by addition of trimethylol propane (6 mol) and xylene diisocyanate (18 mol) and further addition of methyl-terminated polyoxyethylene (1 mol) (number of oxyethylene repeating unit: 90) (produced by Mitsui Chemicals Polyurethanes, Inc., 50% ethyl acetate solution), 1.72 g of pentaerythritol tetraacrylate (SR399E, produced by Sartomer Co., Inc.) and 0.05 g of PIONIN A-41C (produced by Takemoto Oil & Fat Co., Ltd., 70% methanol solution) in 4.46 g of ethyl acetate. The oil phase component was mixed with 17.30 g of water as an aqueous phase component and emulsified using a homogenizer at 10,000 rpm for 15 minutes. The resulting emulsion was stirred at 40° C. for 4 hours. The microgel liquid thus-obtained was diluted using water so as to have the solid content concentration of 21.8% by weight to prepare Microgel (1). The average particle size of the microgel was measured by a light scattering method and found to be 0.25 μm.

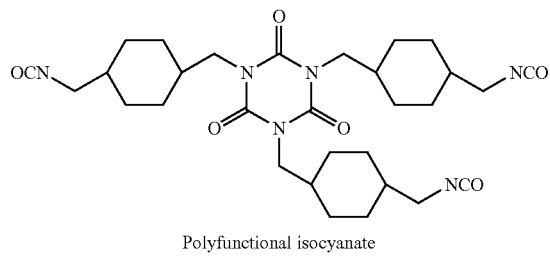

Polyfunctional isocyanate (4) Formation of Oxygen-Blocking Layer

Coating solution (1) for oxygen-blocking layer having the composition shown below was coated on the image-recording layer described above by a bar and dried in an oven at 120° C. for 60 seconds to form an oxygen-blocking layer having a dry coating amount of 0.15 g/m², thereby preparing Lithographic printing plate precursors (1) to (24) according to the invention, respectively.

| <Coating solution (1) for oxygen-blocking layer> | |
|---|---|
| Dispersion of inorganic stratiform compound (1) shown below | 1.5 g |
| Aqueous 6% by weight solution of polyvinyl alcohol (CKS 50, sulfonic acid-modified, saponification degree: 99% by mole or more, polymerization degree: 300, produced by Nippon Synthetic Chemical Industry Co., Ltd.) | 0.55 g |
| Aqueous 6% by weight solution of polyvinyl alcohol (PVA-405, saponification degree: 81.5% by mole, polymerization degree: 500, produced by Kuraray Co., Ltd.) | 0.03 g |
| Aqueous 1% by weight solution of surfactant (EMALEX 710, produced by Nihon Emulsion Co., Ltd.) | 0.86 g |
| Ion-exchanged water | 6.0 g |

<Preparation of Dispersion of Inorganic Stratiform Compound (1)>

To 193.6 g of ion-exchanged water was added 6.4 g of synthetic mica (SOMASIF ME-100, produced by CO-OP Chemical Co., Ltd.) and the mixture was dispersed using a homogenizer until an average particle size (according to a laser scattering method) became 3 μm to prepare Dispersion of inorganic stratiform compound (1). The aspect ratio of the inorganic particle thus-dispersed was 100 or more.

2. Preparation of Lithographic Printing Plate Precursors (25) to (48) According to the Invention Coating solution (2) for image-recording layer was prepared using Photosensitive solution (2) prepared in the same manner as in Photosensitive solution (1) except for eliminating the ultraviolet absorbing agent and Microgel solution (2) using Microgel (2) shown below. Lithographic printing plate precursors (25) to (48) were prepared in the same manner as in the preparation of Lithographic printing plate precursors (1) to (24) except for using Coating solution (2) for image-recording layer in place of Coating solution (1) for image-recording layer, respectively. Specifically, in Lithographic printing plate precursors (25) to (48), the ultraviolet absorbing agent was contained in the image-recording layer in the form of microgel incorporated therein.

(Preparation of Microgel (2))

An oil phase component was prepared by dissolving 4.46 g of polyfunctional isocyanate having the structure shown above (produced by Mitsui Chemicals Polyurethanes, Inc., 75% ethyl acetate solution), 0.86 g of adduct obtained by addition of trimethylol propane (6 mol) and xylene diisocyanate (18 mol) and further addition of methyl-terminated polyoxyethylene (1 mol) (number of oxyethylene repeating unit: 90) (produced by Mitsui Chemicals Polyurethanes, Inc., 50% ethyl acetate solution), 1.72 g of pentaerythritol tetraacrylate (SR399E, produced by Sartomer Co., Inc.), 0.05 g of PIONIN A-41C (produced by Takemoto Oil & Fat Co., Ltd., 70% methanol solution) and 5 g of an ultraviolet absorbing agent shown in Table 1-2 in 4.46 g of ethyl acetate. The oil phase component was mixed with 17.30 g of water as an aqueous phase component and emulsified using a homogenizer at 10,000 rpm for 15 minutes. The resulting emulsion was stirred at 40° C. for 4 hours. The microgel liquid thus-obtained was diluted using water so as to have the solid content concentration of 21.8% by weight to prepare Microgel (2). The average particle size of the microgel was measured by a light scattering method and found to be 0.25 μm.

3. Preparation of Lithographic Printing Plate Precursor (49) for Comparative Example 1

Lithographic printing plate precursor (49) for Comparative Example 1 containing no ultraviolet absorbing agent was prepared in the same manner as in the preparation of Lithographic printing plate precursor (1) except for using Coating solution (10) for image-recording layer composed of Photosensitive solution (2) and Microgel solution (1).

4. Preparation of Lithographic Printing Plate Precursor (50) for Comparative Example 2

Lithographic printing plate precursor (50) for Comparative Example 2 containing an ultraviolet absorbing agent in an oxygen-blocking layer was prepared in the same manner as in the preparation of Lithographic printing plate precursor (49) except for using Coating solution (2) for oxygen-blocking layer shown below in place of Coating solution (1) for oxygen-blocking layer.

| <Coating solution (2) for oxygen-blocking layer> | |
|---|---|
| Ultraviolet absorbing agent I-10 | 0.01 g |
| Dispersion of inorganic stratiform compound (1) shown above | 1.5 g |
| Aqueous 6% by weight solution of polyvinyl alcohol (CKS 50, sulfonic acid-modified, saponification degree: 99% by mole or more, polymerization degree: 300, produced by Nippon Synthetic Chemical Industry Co., Ltd.) | 0.55 g |
| Aqueous 6% by weight solution of polyvinyl alcohol (PVA-405, saponification degree: 81.5% by mole, polymerization degree: 500, produced by Kuraray Co., Ltd.) | 0.03 g |
| Aqueous 1% by weight solution of surfactant (EMALEX 710, produced by Nihon Emulsion Co., Ltd.) | 0.86 g |
| Ion-exchanged water | 6.0 g |

5. Evaluation of Lithographic Printing Plate Precursor

The lithographic printing plate precursors according to the invention and for comparison were evaluated in the manner shown below. The results obtained are shown in Tables 1-1 and 1-2.

(1) On-Press Development Property

Each of the lithographic printing plate precursors thus-obtained was exposed by LUXEL PLATESETTER T-6000III equipped with an infrared semiconductor laser (produced by FUJIFILM Corp.) under the conditions of a rotational number of an external drum of 1,000 rpm, laser output of 70% and resolution of 2,400 dpi. The exposed image contained a solid image and a 50% halftone dot chart of a 20 μm-dot FM screen.

The exposed lithographic printing plate precursor was mounted without undergoing development processing on a plate cylinder of a printing machine (LITHRONE 26, produced by Komori Corp.). Using dampening water (ECOLITY-2 (produced by FUJIFILM Corp.)/tap water=2/98 (volume ratio)) and VALUES-G (N) Black Ink (produced by Dainippon Ink & Chemicals, Inc.), the dampening water and ink were supplied according to the standard automatic printing start method of LITHRONE 26 to conduct printing on 100 sheets of TOKUBISHI ART PAPER (76.5 kg) at a printing speed of 10,000 sheets per hour.

A number of the printing papers required until the on-press development of the unexposed area of the image-recording layer on the printing machine was completed to reach a state where the ink was not transferred to the printing paper in the non-image area was measured to evaluate the on-press development property.

Further, for evaluation of mercury lamp resistance, the exposed lithographic printing plate precursor was allowed to stand for one hour under condition controlling the illuminance at 500 lux using a high pressure mercury lamp of 5,700 K and then evaluated the on-press development property in the same manner as described above.

(2) Printing Durability

After performing the evaluation for the on-press development property described above, the printing was continued. As the increase in a number of printing papers, the image-recording layer was gradually abraded to cause decrease in the ink density on the printing paper. A number of the printing papers wherein a value obtained by measuring a halftone dot area rate of the 50% halftone dot of FM screen on the printing paper using a Gretag densitometer decreased by 5% from the value measured on the 100$^{th}$ paper of the printing was determined to evaluate the printing durability.

Examples 49 to 96 and Comparative Example 3

6. Preparation of Lithographic Printing Plate Precursors (51) to (74) According to the Invention Coating solution (3) for image-recording layer shown below was coated on the support provided with the undercoat layer described above by a bar and dried in an oven at 70° C. for 60 seconds to form an image-recording layer having a dry coating amount of 0.6 g/m$^2$, thereby preparing Lithographic printing plate precursors (51) to (74), respectively.

| <Coating solution (3) for image-recording layer> | |
|---|---|
| Ultraviolet absorbing agent shown in Table 1-3 | 0.2 g |
| Aqueous dispersion of polymer fine particle (1) shown below | 20.0 g |
| Infrared absorbing agent (2) having structure shown below | 0.2 g |
| Radical polymerization initiator (IRGACURE 250, produced by Ciba Specialty Chemicals, Inc.) | 0.5 g |
| Radical polymerizable compound (SR-399, produced by Sartomer Co., Inc.) | 1.55 g |
| Mercapto-3-triazole | 0.2 g |
| BYK 336 (produced by BYK-Chemie GmbH) | 0.4 g |
| KLUCEL M (produced by Hercules Chemical Co., Inc.) | 4.8 g |
| ELVACITE 4026 (produced by Ineos Acrylics Inc.) | 2.5 g |
| n-Propanol | 55.0 g |
| 2-Butanone | 17.0 g |

The compounds indicated using their trade names in the composition above are shown below.

RGACURE 250: (4-Methoxyphenyl)[4-(2-methylpropyl)phenyl]iodonium hexafluorophosphate (75% by weight propylene carbonate solution)

R-399: Dipentaerythritol pentaacrylate

YK 336: Modified dimethylpolysiloxane copolymer (25% by weight xylene/methoxypropyl acetate solution)

KLUCEL M: Hydroxypropyl cellulose (2% by weight aqueous solution)

ELVACITE 4026: Highly branched polymethyl methacrylate (10% by weight 2-butanone solution)

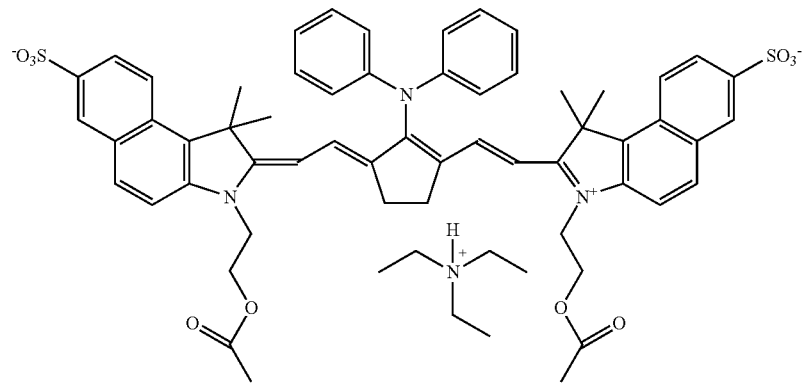

Infrared absorbing agent (2)

(Preparation of Aqueous Dispersion of Polymer Fine Particle (1))

A stirrer, a thermometer, a dropping funnel, a nitrogen inlet tube and a reflux condenser were attached to a 1,000 ml four-neck flask and while carrying out deoxygenation by introduction of nitrogen gas, 10 g of polyethylene glycol methyl ether methacrylate (PEGMA, average number of ethylene glycol repeating units: 50), 200 g of distilled water and 200 g of n-propanol were charged therein and heated until the internal temperature reached 70° C. Then, a mixture of 10 g of styrene (St), 80 g of acrylonitrile (AN) and 0.8 g of 2,2'-azobisisobutyronitrile previously prepared was dropwise added to the flask over a period of one hour. After the completion of the dropwise addition, the reaction was continued as it was for 5 hours. Then, 0.4 g of 2,2'-azobisisobutyronitrile was added and the internal temperature was raised to 80° C. Thereafter, 0.5 g of 2,2'-azobisisobutyronitrile was added over a period of 6 hours. At the stage after reacting for 20 hours in total, the polymerization proceeded 98% or more to obtain Aqueous dispersion of polymer fine particle (1) of PEGMA/St/AN (10/10/80 in a weight ratio). The particle size distribution of the polymer fine particle had the maximum value at the particle size of 150 nm The particle size distribution was determined by taking an electron microphotograph of the polymer fine particle, measuring particle sizes of 5,000 fine particles in total on the photograph, and dividing a range from the largest value of the particle size measured to 0 on a logarithmic scale into 50 parts to obtain occurrence frequency of each particle size by plotting. With respect to the aspherical particle, a particle size of a spherical particle having a particle area equivalent to the particle area of the aspherical particle on the photograph was defined as the particle size.

7. Preparation of Lithographic Printing Plate Precursor (99) for Comparative Example 3

Lithographic printing plate precursor (99) for Comparative Example 3 containing no ultraviolet absorbing agent was prepared in the same manner as in the preparation of Lithographic printing plate precursor (51) except for using Coating solution (20) for image-recording layer prepared by eliminating the ultraviolet absorbing agent from Coating solution (3) for image-recording layer.

8. Preparation of Lithographic Printing Plate Precursors (75) to (98) According to the Invention Lithographic printing plate precursors (75) to (98) containing the ultraviolet absorbing agent incorporated into polymer fine particle in the image-recording layer were prepared in the same manner as in the preparation of Lithographic printing plate precursors (51) to (74) except for using Coating solution (4) for image-recording layer shown below in place of Coating solution (3) for image-recording layer, respectively.

| <Coating solution (4) for image-recording layer> | |
|---|---|
| Aqueous dispersion of polymer fine particle (2) shown below | 20.0 g |
| Infrared absorbing agent (2) having structure shown above | 0.2 g |
| Radical polymerization initiator (IRGACURE 250, produced by Ciba Specialty Chemicals, Inc.) | 0.5 g |
| Radical polymerizable compound (SR-399, produced by Sartomer Co., Inc.) | 1.55 g |
| Mercapto-3-triazole | 0.2 g |
| BYK 336 (produced by BYK-Chemie GmbH) | 0.4 g |

| <Coating solution (4) for image-recording layer> | |
|---|---|
| KLUCEL M (produced by Hercules Chemical Co., Inc.) | 4.8 g |
| ELVACITE 4026 (produced by Ineos Acrylics Inc.) | 2.5 g |
| n-Propanol | 55.0 g |
| 2-Butanone | 17.0 g |

(Preparation of Aqueous Dispersion of Polymer Fine Particle (2))

A stirrer, a thermometer, a dropping funnel, a nitrogen inlet tube and a reflux condenser were attached to a 1,000 ml four-neck flask and while carrying out deoxygenation by introduction of nitrogen gas, 10 g of polyethylene glycol methyl ether methacrylate (PEGMA, average number of ethylene glycol repeating units: 50), 200 g of distilled water and 200 g of n-propanol were charged therein and heated until the internal temperature reached 70° C. Then, a mixture of 10 g of styrene (St), 80 g of acrylonitrile (AN), 0.8 g of 2,2'-azobisisobutyronitrile and 5 g of an ultraviolet absorbing agent shown in Table 1-4 previously prepared was dropwise added to the flask over a period of one hour. After the completion of the dropwise addition, the reaction was continued as it was for 5 hours. Then, 0.4 g of 2,2'-azobisisobutyronitrile was added and the internal temperature was raised to 80° C. Thereafter, 0.5 g of 2,2'-azobisisobutyronitrile was added over a period of 6 hours. At the stage after reacting for 20 hours in total, the polymerization proceeded 98% or more to obtain Aqueous dispersion of polymer fine particle (2) of PEGMA/St/AN (10/10/80 in a weight ratio) having the ultraviolet absorbing agent incorporated therein. The particle size distribution of the polymer fine particle had the maximum value at the particle size of 150 nm.

9. Evaluation of Lithographic Printing Plate Precursor

Lithographic printing plate precursors (51) to (99) thus-obtained were evaluated in the same manner as in Lithographic printing plate precursors (1) to (50). The results obtained are shown in Tables 1-3 and 1-4.

Comparative Examples 4 to 20

10. Preparation of Lithographic Printing Plate Precursors (100) to (108) for Comparison Lithographic printing plate precursors (100) to (107) and (108) were prepared in the same manner as in the preparation of Lithographic printing plate precursors (67) to (74) and (99) except for changing Coating solution (3) for image-recording layer in Lithographic printing plate precursors (67) to (74) to Coating solution (5) for image-recording layer shown below, respectively.

<Coating Solution (5) for Image-Recording Layer>

Coating solution (5) for image-recording layer was prepared in the same manner as in Coating solution (3) for image-recording layer except for using 72 g of Aqueous dispersion of polymer fine particle (3) shown below in place of 20.0 g of Aqueous dispersion of polymer fine particle (1) used in Coating solution (3) for image-recording layer.

(Preparation of Aqueous Dispersion of Polymer Fine Particle (3))

In a 200 ml three-neck flask equipped with a mechanical stirrer were charged 85 g of water, 0.3 g of sodium dodecylsulfate (SDS), 4.5 g of acrylonitrile and 0.5 g of styrene to completely dissolve. The system was substituted with nitrogen and nitrogen was flowed at a flow rate of 10 ml/min. After raising the temperature to 70° C., an aqueous potassium persulfate solution (containing 0.27 g of potassium persulfate and 10 g of water) was dropwise added thereto over a period of 2 hours with stirring at rotation speed of 300 rpm. After the completion of the dropwise addition, the mixture was stirred at 70° C. for 3 hours and then the temperature was raised to 80° C., followed by stirring for 2 hours. Thus, Aqueous dispersion of polymer fine particle (3) of St/AN (10/90 in a weight ratio) was obtained. The particle size distribution of the polymer fine particle had the maximum value at the particle size of 125 nm. The solid content was 5.5% by weight.

11. Preparation of Lithographic Printing Plate Precursors (109) to (116) for Comparison Lithographic printing plate precursors (109) to (116) were prepared in the same manner as in the preparation of Lithographic printing plate precursors (91) to (98) except for changing Coating solution (4) for image-recording layer in Lithographic printing plate precursors (91) to (98) to Coating solution (6) for image-recording layer shown below, respectively.

<Coating Solution (6) for Image-Recording Layer>

Coating solution (6) for image-recording layer was prepared in the same manner as in Coating solution (4) for image-recording layer except for using 72 g of Aqueous dispersion of polymer fine particle (4) shown below in place of 20.0 g of Aqueous dispersion of polymer fine particle (2) used in Coating solution (4) for image-recording layer.

(Preparation of Aqueous Dispersion of Polymer Fine Particle (4))

In a 200 ml three-neck flask equipped with a mechanical stirrer were charged 85 g of water, 0.3 g of sodium dodecylsulfate (SDS), 4.5 g of acrylonitrile, 0.5 g of styrene and 5 g of an ultraviolet absorbing agent shown in Table 1-6 to completely dissolve. The system was substituted with nitrogen and nitrogen was flowed at a flow rate of 10 ml/min. After raising the temperature to 70° C., an aqueous potassium persulfate solution (containing 0.27 g of potassium persulfate and 10 g of water) was dropwise added thereto over a period of 2 hours with stirring at rotation speed of 300 rpm. After the completion of the dropwise addition, the mixture was stirred at 70° C. for 3 hours and then the temperature was raised to 80° C., followed by stirring for 2 hours. Thus, Aqueous dispersion of polymer fine particle (4) of St/AN (10/90 in a weight ratio) was obtained. The particle size distribution of the polymer fine particle had the maximum value at the particle size of 125 nm. The solid content was 5.5% by weight.

12. Evaluation of Lithographic Printing Plate Precursor

Lithographic printing plate precursors (100) to (116) thus-obtained were evaluated in the same manner as in Lithographic printing plate precursors (1) to (50). The results obtained are shown in Tables 1-5 and 1-6.

TABLE 1-1

Evaluation results in the case where the ultraviolet absorbing agent was directly added to the image-recording layer (1)

| | Lithographic Printing Plate Precursor | Ultraviolet Absorbing Agent (added to Image-Recording Layer) | On-Press Development Property Under Ordinary Condition (sheets) | Under Condition of Irradiation with Mercury Lamp (sheets) | Printing Durability ($\times 10^4$ sheets) |
|---|---|---|---|---|---|
| Example 1 | 1 | I-11 (Formula 1) | 30 | 35 | 4 |
| Example 2 | 2 | VII-7 (Formula 2) | 30 | 35 | 4 |
| Example 3 | 3 | III-8 (Formula 4) | 30 | 35 | 4 |
| Example 4 | 4 | II-1 (Formula 5) | 30 | 35 | 4 |
| Example 5 | 5 | IV-2 (Formula 6) | 30 | 40 | 4 |
| Example 6 | 6 | V-2 (Formula 7) | 35 | 35 | 4 |
| Example 7 | 7 | VI-1 (Formula 8) | 28 | 30 | 4 |
| Example 8 | 8 | S-05 (Formula 9) | 28 | 30 | 4 |
| Example 9 | 9 | I-10 (Formula 1) | 38 | 43 | 4 |
| Example 10 | 10 | VII-6 (Formula 2) | 38 | 44 | 4 |
| Example 11 | 11 | III-4 (Formula 4) | 36 | 42 | 4 |
| Example 12 | 12 | II-7 (Formula 5) | 34 | 40 | 4 |
| Example 13 | 13 | IV-7 (Formula 6) | 38 | 43 | 4 |
| Example 14 | 14 | V-6 (Formula 7) | 36 | 41 | 4 |
| Example 15 | 15 | VI-7 (Formula 8) | 39 | 44 | 4 |
| Example 16 | 16 | S-03 (Formula 9) | 38 | 43 | 4 |
| Example 17 | 17 | I-16 (Formula 1) | 28 | 32 | 4 |
| Example 18 | 18 | VII-14 (Formula 2) | 28 | 32 | 4 |
| Example 19 | 19 | III-9 (Formula 4) | 29 | 32 | 4 |
| Example 20 | 20 | II-6 (Formula 5) | 28 | 33 | 4 |
| Example 21 | 21 | IV-6 (Formula 6) | 28 | 37 | 4 |
| Example 22 | 22 | V-5 (Formula 7) | 32 | 34 | 4 |
| Example 23 | 23 | VI-3 (Formula 8) | 28 | 31 | 4 |
| Example 24 | 24 | S-30 (Formula 9) | 28 | 31 | 4 |
| Comparative Example 1 | 49 | None | 20 | 100 | 4 |
| Comparative Example 2 | 50 | I-10 (added to Oxygen-Blocking Layer) | 40 | 100 | 3 |

TABLE 1-2

Evaluation results in the case where the ultraviolet absorbing agent was incorporated into microgel and added to the image-recording layer (1)

| | Lithographic Printing Plate Precursor | Ultraviolet Absorbing Agent (added to Image-Recording Layer) | On-Press Development Property | | Printing Durability ($\times 10^4$ sheets) |
|---|---|---|---|---|---|
| | | | Under Ordinary Condition (sheets) | Under Condition of Irradiation with Mercury Lamp (sheets) | |
| Example 25 | 25 | I-11 (Formula 1) | 23 | 26 | 4 |
| Example 26 | 26 | VII-7 (Formula 2) | 22 | 24 | 4 |
| Example 27 | 27 | III-8 (Formula 4) | 26 | 27 | 4 |
| Example 28 | 28 | II-1 (Formula 5) | 22 | 26 | 4 |
| Example 29 | 29 | IV-2 (Formula 6) | 23 | 27 | 4 |
| Example 30 | 30 | V-2 (Formula 7) | 24 | 28 | 4 |
| Example 31 | 31 | VI-1 (Formula 8) | 22 | 26 | 4 |
| Example 32 | 32 | S-05 (Formula 9) | 23 | 27 | 4 |
| Example 33 | 33 | I-10 (Formula 1) | 27 | 30 | 4 |
| Example 34 | 34 | VII-6 (Formula 2) | 27 | 30 | 4 |
| Example 35 | 35 | III-4 (Formula 4) | 29 | 33 | 4 |
| Example 36 | 36 | II-7 (Formula 5) | 27 | 31 | 4 |
| Example 37 | 37 | IV-7 (Formula 6) | 28 | 30 | 4 |
| Example 38 | 38 | V-6 (Formula 7) | 27 | 32 | 4 |
| Example 39 | 39 | VI-7 (Formula 8) | 28 | 30 | 4 |
| Example 40 | 40 | S-03 (Formula 9) | 27 | 30 | 4 |
| Example 41 | 41 | I-16 (Formula 1) | 20 | 22 | 4 |
| Example 42 | 42 | VII-14 (Formula 2) | 20 | 21 | 4 |
| Example 43 | 43 | III-9 (Formula 4) | 25 | 25 | 4 |
| Example 44 | 44 | II-6 (Formula 5) | 20 | 23 | 4 |
| Example 45 | 45 | IV-6 (Formula 6) | 20 | 25 | 4 |
| Example 46 | 46 | V-5 (Formula 7) | 22 | 25 | 4 |
| Example 47 | 47 | VI-3 (Formula 8) | 20 | 24 | 4 |
| Example 48 | 48 | S-30 (Formula 9) | 21 | 25 | 4 |

TABLE 1-3

Evaluation results in the case where the ultraviolet absorbing agent was directly added to the image-recording layer (2)

| | Lithographic Printing Plate Precursor | Ultraviolet Absorbing Agent (added to Image-Recording Layer) | On-Press Development Property | | Printing Durability ($\times 10^4$ sheets) |
|---|---|---|---|---|---|
| | | | Under Ordinary Condition (sheets) | Under Condition of Irradiation with Mercury Lamp (sheets) | |
| Example 49 | 51 | I-11 (Formula 1) | 30 | 35 | 3 |
| Example 50 | 52 | VII-7 (Formula 2) | 30 | 35 | 3 |
| Example 51 | 53 | III-8 (Formula 4) | 30 | 35 | 3 |
| Example 52 | 54 | II-1 (Formula 5) | 30 | 35 | 3 |
| Example 53 | 55 | IV-2 (Formula 6) | 35 | 35 | 3 |
| Example 54 | 56 | V-2 (Formula 7) | 35 | 40 | 3 |
| Example 55 | 57 | VI-1 (Formula 8) | 35 | 40 | 3 |
| Example 56 | 58 | S-05 (Formula 9) | 35 | 40 | 3 |
| Example 57 | 59 | I-10 (Formula 1) | 40 | 45 | 3 |
| Example 58 | 60 | VII-6 (Formula 2) | 40 | 45 | 3 |
| Example 59 | 61 | III-4 (Formula 4) | 40 | 45 | 3 |
| Example 60 | 62 | II-7 (Formula 5) | 40 | 45 | 3 |
| Example 61 | 63 | IV-7 (Formula 6) | 45 | 50 | 3 |
| Example 62 | 64 | V-6 (Formula 7) | 45 | 50 | 3 |
| Example 63 | 65 | VI-7 (Formula 8) | 45 | 50 | 3 |
| Example 64 | 66 | S-03 (Formula 9) | 45 | 50 | 3 |
| Example 65 | 67 | I-16 (Formula 1) | 28 | 33 | 3 |
| Example 66 | 68 | VII-14 (Formula 2) | 29 | 33 | 3 |
| Example 67 | 69 | III-9 (Formula 4) | 28 | 34 | 3 |
| Example 68 | 70 | II-6 (Formula 5) | 29 | 33 | 3 |
| Example 69 | 71 | IV-6 (Formula 6) | 33 | 35 | 3 |
| Example 70 | 72 | V-5 (Formula 7) | 32 | 37 | 3 |
| Example 71 | 73 | VI-3 (Formula 8) | 33 | 39 | 3 |

TABLE 1-3-continued

Evaluation results in the case where the ultraviolet absorbing agent was directly added to the image-recording layer (2)

| | Lithographic Printing Plate Precursor | Ultraviolet Absorbing Agent (added to Image-Recording Layer) | On-Press Development Property | | Printing Durability ($\times 10^4$ sheets) |
|---|---|---|---|---|---|
| | | | Under Ordinary Condition (sheets) | Under Condition of Irradiation with Mercury Lamp (sheets) | |
| Example 72 | 74 | S-30 (Formula 9) | 34 | 38 | 3 |
| Comparative Example 3 | 99 | None | 25 | Not Developed | 3 |

TABLE 1-4

Evaluation results in the case where the ultraviolet absorbing agent was incorporated into polymer fine particle and added to the image-recording layer (2)

| | Lithographic Printing Plate Precursor | Ultraviolet Absorbing Agent (added to Image-Recording Layer) | On-Press Development Property | | Printing Durability ($\times 10^4$ sheets) |
|---|---|---|---|---|---|
| | | | Under Ordinary Condition (sheets) | Under Condition of Irradiation with Mercury Lamp (sheets) | |
| Example 73 | 75 | I-11 (Formula 1) | 27 | 29 | 3 |
| Example 74 | 76 | VII-7 (Formula 2) | 28 | 31 | 3 |
| Example 75 | 77 | III-8 (Formula 4) | 30 | 33 | 3 |
| Example 76 | 78 | II-1 (Formula 5) | 29 | 34 | 3 |
| Example 77 | 79 | IV-2 (Formula 6) | 27 | 32 | 3 |
| Example 78 | 80 | V-2 (Formula 7) | 27 | 29 | 3 |
| Example 79 | 81 | VI-1 (Formula 8) | 32 | 36 | 3 |
| Example 80 | 82 | S-05 (Formula 9) | 28 | 34 | 3 |
| Example 81 | 83 | I-10 (Formula 1) | 31 | 36 | 3 |
| Example 82 | 84 | VII-6 (Formula 2) | 32 | 37 | 3 |
| Example 83 | 85 | III-4 (Formula 4) | 34 | 38 | 3 |
| Example 84 | 86 | II-7 (Formula 5) | 32 | 40 | 3 |
| Example 85 | 87 | IV-7 (Formula 6) | 32 | 40 | 3 |
| Example 86 | 88 | V-6 (Formula 7) | 33 | 40 | 3 |
| Example 87 | 89 | VI-7 (Formula 8) | 35 | 44 | 3 |
| Example 88 | 90 | S-03 (Formula 9) | 34 | 40 | 3 |
| Example 89 | 91 | I-16 (Formula 1) | 25 | 25 | 3 |
| Example 90 | 92 | VII-14 (Formula 2) | 25 | 27 | 3 |
| Example 91 | 93 | III-9 (Formula 4) | 25 | 28 | 3 |
| Example 92 | 94 | II-6 (Formula 5) | 27 | 30 | 3 |
| Example 93 | 95 | IV-6 (Formula 6) | 25 | 28 | 3 |
| Example 94 | 96 | V-5 (Formula 7) | 25 | 25 | 3 |
| Example 95 | 97 | VI-3 (Formula 8) | 30 | 32 | 3 |
| Example 96 | 98 | S-30 (Formula 9) | 25 | 27 | 3 |

TABLE 1-5

Evaluation results in the case where the ultraviolet absorbing agent was directly added to the image-recording layer (3)

| | Lithographic Printing Plate Precursor | Ultraviolet Absorbing Agent (added to Image-Recording Layer) | On-Press Development Property | | Printing Durability ($\times 10^4$ sheets) |
|---|---|---|---|---|---|
| | | | Under Ordinary Condition (sheets) | Under Condition of Irradiation with Mercury Lamp (sheets) | |
| Comparative Example 4 | 100 | I-16 (Formula 1) | 100 | Not Developed | 3.5 |
| Comparative Example 5 | 101 | VII-14 (Formula 2) | 100 | Not Developed | 3.5 |
| Comparative Example 6 | 102 | III-9 (Formula 4) | 100 | Not Developed | 3.5 |

TABLE 1-5-continued

Evaluation results in the case where the ultraviolet absorbing agent was directly added to the image-recording layer (3)

| | Lithographic Printing Plate Precursor | Ultraviolet Absorbing Agent (added to Image-Recording Layer) | On-Press Development Property | | Printing Durability ($\times 10^4$ sheets) |
|---|---|---|---|---|---|
| | | | Under Ordinary Condition (sheets) | Under Condition of Irradiation with Mercury Lamp (sheets) | |
| Comparative Example 7 | 103 | II-6 (Formula 5) | 100 | Not Developed | 3.5 |
| Comparative Example 8 | 104 | IV-6 (Formula 6) | 100 | Not Developed | 3.5 |
| Comparative Example 9 | 105 | V-5 (Formula 7) | 100 | Not Developed | 3.5 |
| Comparative Example 10 | 106 | VI-3 (Formula 8) | 100 | Not Developed | 3.5 |
| Comparative Example 11 | 107 | S-30 (Formula 9) | 100 | Not Developed | 3.5 |
| Comparative Example 12 | 108 | None | 80 | Not Developed | 3.5 |

TABLE 1-6

Evaluation results in the case where the ultraviolet absorbing agent was incorporated into polymer fine particle and added to the image-recording layer (3)

| | Lithographic Printing Plate Precursor | Ultraviolet Absorbing Agent (added to Image-Recording Layer) | On-Press Development Property | | Printing Durability ($\times 10^4$ sheets) |
|---|---|---|---|---|---|
| | | | Under Ordinary Condition (sheets) | Under Condition of Irradiation with Mercury Lamp (sheets) | |
| Comparative Example 13 | 109 | I-16 (Formula 1) | 85 | Not Developed | 3.5 |
| Comparative Example 14 | 110 | VII-14 (Formula 2) | 85 | Not Developed | 3.5 |
| Comparative Example 15 | 111 | III-9 (Formula 4) | 85 | Not Developed | 3.5 |
| Comparative Example 16 | 112 | II-6 (Formula 5) | 85 | Not Developed | 3.5 |
| Comparative Example 17 | 113 | IV-6 (Formula 6) | 85 | Not Developed | 3.5 |
| Comparative Example 18 | 114 | V-5 (Formula 7) | 85 | Not Developed | 3.5 |
| Comparative Example 19 | 115 | VI-3 (Formula 8) | 85 | Not Developed | 3.5 |
| Comparative Example 20 | 116 | S-30 (Formula 9) | 85 | Not Developed | 3.5 |

From the results shown in Tables 1-1, 1-2, 1-3, 1-4, 1-5 and 1-6, the following can be seen:

It can be seen that the on-press development property is severely deteriorated upon preservation under a mercury lamp in Comparative Examples 1 and 3 in which the ultraviolet absorbing agent is not contained. Also, in Comparative Example 2 in which the ultraviolet absorbing agent is contained in the oxygen-blocking layer, the on-press development property is poor just after the image exposure (under ordinary condition) and it is further deteriorated upon the preservation under a mercury lamp.

The lithographic printing plate precursor containing the ultraviolet absorbing agent in its image-recording layer exhibits the desired effect of improving the on-press development property upon the preservation under a mercury lamp. But, in the case of using the ultraviolet absorbing agent containing an alkyl group having a small number of carbon atoms as a substituent, it is observed in some cases that the on-press development property is somewhat deteriorated just after the image exposure. However, when the ultraviolet absorbing agent is incorporated into a polymer fine particle, the effect can be achieved that the on-press development property is not deteriorated just after the image exposure and it is hardly deteriorated even when allowed to stand under irradiation with a mercury lamp. In particular, in the case of using the ultraviolet absorbing agent containing an alkyl group having a large number of carbon atoms as a substituent, it is easily incorporated into the polymer fine particle and the remarkable effect of preventing the degradation of the on-press development property due to the irradiation with a mercury lamp is obtained. From these results, it is apparent that the excellent lithographic printing plate precursor greatly improved in the handling property in the field of printing can be obtained.

Further, it can also be found that the on-press development property is improved by incorporating a polyoxyalkylene structure into the polymer by comparison of the results in Tables 1-3 with those in Table 1-5 and comparison of the results in Tables 1-4 with those in Table 1-6.

From the above results, the effects of the invention are clear.

The entire disclosure of Japanese Patent Application No. 2009-225554 filed on Sep. 29, 2009, from which the benefit of foreign priority has been claimed in the present application, is incorporated herein by reference, as if fully set forth.

What is claimed is:

1. A lithographic printing plate precursor, comprising a support having thereon an image-recording layer containing (A) an infrared absorbing agent, (B) a radical polymerization initiator, (C) a radical polymerizable compound, (D) a polymer compound containing a polyoxyalkylene structure and (E) an ultraviolet absorbing agent and being capable of forming an image by supplying at least one of printing ink and dampening water on a printing machine after imagewise exposure to remove an unexposed area of the image-recording layer, wherein the ultraviolet absorbing agent (E) is represented by formulae (2) shown below:

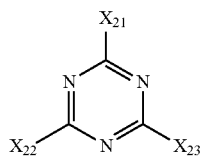

Formula (2)

in formula (2), $X_{21}$ to $X_{23}$ each independently represents an alkyl group, an aryl group, an alkoxy group, an aryloxy group or a heterocyclic group, provided that at least one of $X_{21}$ to $X_{23}$ represents a group represented by formula (3) shown below:

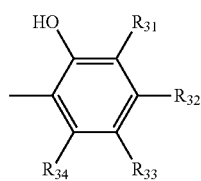

Formula (3)

in formula (3), $R_{31}$ to $R_{34}$ each independently represents a hydrogen atom or a substituent.

2. The lithographic printing plate precursor according to claim 1, wherein the ultraviolet absorbing agent (E) contains an alkyl group having from 8 to 20 carbon atoms.

3. The lithographic printing plate precursor according to claim 1, wherein the ultraviolet absorbing agent (E) is incorporated into a polymer fine particle.

4. The lithographic printing plate precursor according to claim 1, wherein the polymer compound containing a polyoxyalkylene structure (D) is a polymer fine particle.

5. The lithographic printing plate precursor according to claim 1, which comprises an oxygen-blocking layer on the image-recording layer.

6. A plate making method of a lithographic printing plate, comprising imagewise exposing the lithographic printing plate precursor according to claim 1, and then without undergoing a development processing step, removing an unexposed area of the image-recording layer by supplying at least one of printing ink and dampening water on a printing machine to prepare a lithographic printing plate.

* * * * *